US011714172B2

(12) United States Patent
Ozawa et al.

(10) Patent No.: US 11,714,172 B2
(45) Date of Patent: Aug. 1, 2023

(54) LIGHT RECEPTION DEVICE AND DISTANCE MEASUREMENT DEVICE

(71) Applicant: Sony Semiconductor Solutions Corporation, Kanagawa (JP)

(72) Inventors: Osamu Ozawa, Tokyo (JP); Hayato Kamizuru, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 113 days.

(21) Appl. No.: 16/957,253

(22) PCT Filed: Apr. 9, 2019

(86) PCT No.: PCT/JP2019/015423
§ 371 (c)(1),
(2) Date: Jun. 23, 2020

(87) PCT Pub. No.: WO2019/203057
PCT Pub. Date: Oct. 24, 2019

(65) Prior Publication Data
US 2021/0025990 A1 Jan. 28, 2021

(30) Foreign Application Priority Data
Apr. 20, 2018 (JP) .................................. 2018-081068

(51) Int. Cl.
*G01S 7/48* (2006.01)
*G01S 7/4863* (2020.01)
(Continued)

(52) U.S. Cl.
CPC ............ *G01S 7/4863* (2013.01); *G01S 7/487* (2013.01); *G01S 17/10* (2013.01); *H01L 31/107* (2013.01)

(58) Field of Classification Search
CPC ........ G01S 7/4863; G01S 7/487; G01S 17/10; G01S 7/4914; G01S 7/4918; G01S 17/88;
(Continued)

(56) References Cited

U.S. PATENT DOCUMENTS

2011/0164132 A1 7/2011 Buettgen
2012/0249998 A1 10/2012 Eisele et al.
(Continued)

FOREIGN PATENT DOCUMENTS

JP 2006253876 A 9/2006
JP 2007288522 A 11/2007
(Continued)

OTHER PUBLICATIONS

International Search Report and Written Opinion dated Jul. 11, 2019 in connection with International Application No. PCT/JP2019/015423.

*Primary Examiner* — Tony Ko
(74) *Attorney, Agent, or Firm* — Wolf, Greenfield & Sacks, P.C.

(57) ABSTRACT

A light reception device comprises a pixel array including a plurality of pixels, each of the plurality of pixels including a photosensitive element configured to generate a signal in response to detection of a photon by the photosensitive element, wherein the plurality of pixels include a first pixel having a first sensitivity to detect a first photon incident on the first pixel and a second pixel having a second sensitivity to detect a second photon incident on the second pixel, wherein the second sensitivity is lower than the first sensitivity.

18 Claims, 14 Drawing Sheets

(51) Int. Cl.
*G01S 7/487* (2006.01)
*G01S 17/10* (2020.01)
*H01L 31/107* (2006.01)

(58) Field of Classification Search
CPC ... H01L 31/107; H01L 27/14607; H04N 5/32; G01J 2001/442; G01J 2001/4433; G01J 2001/444
See application file for complete search history.

(56) References Cited

U.S. PATENT DOCUMENTS

| | | |
|---|---|---|
| 2015/0357360 A1 | 12/2015 | Tian et al. |
| 2017/0366726 A1 | 12/2017 | Yanagida et al. |
| 2020/0044098 A1* | 2/2020 | Azuma ................ G01S 7/486 |
| 2020/0284883 A1* | 9/2020 | Ferreira .............. G01S 7/4817 |

FOREIGN PATENT DOCUMENTS

| | | |
|---|---|---|
| JP | 2008084962 A | 4/2008 |
| JP | 2014-081254 A | 5/2014 |
| JP | 2016103708 A | 6/2016 |
| JP | 2017108380 A | 6/2017 |
| WO | WO-2017/138370 A1 | 8/2017 |

* cited by examiner

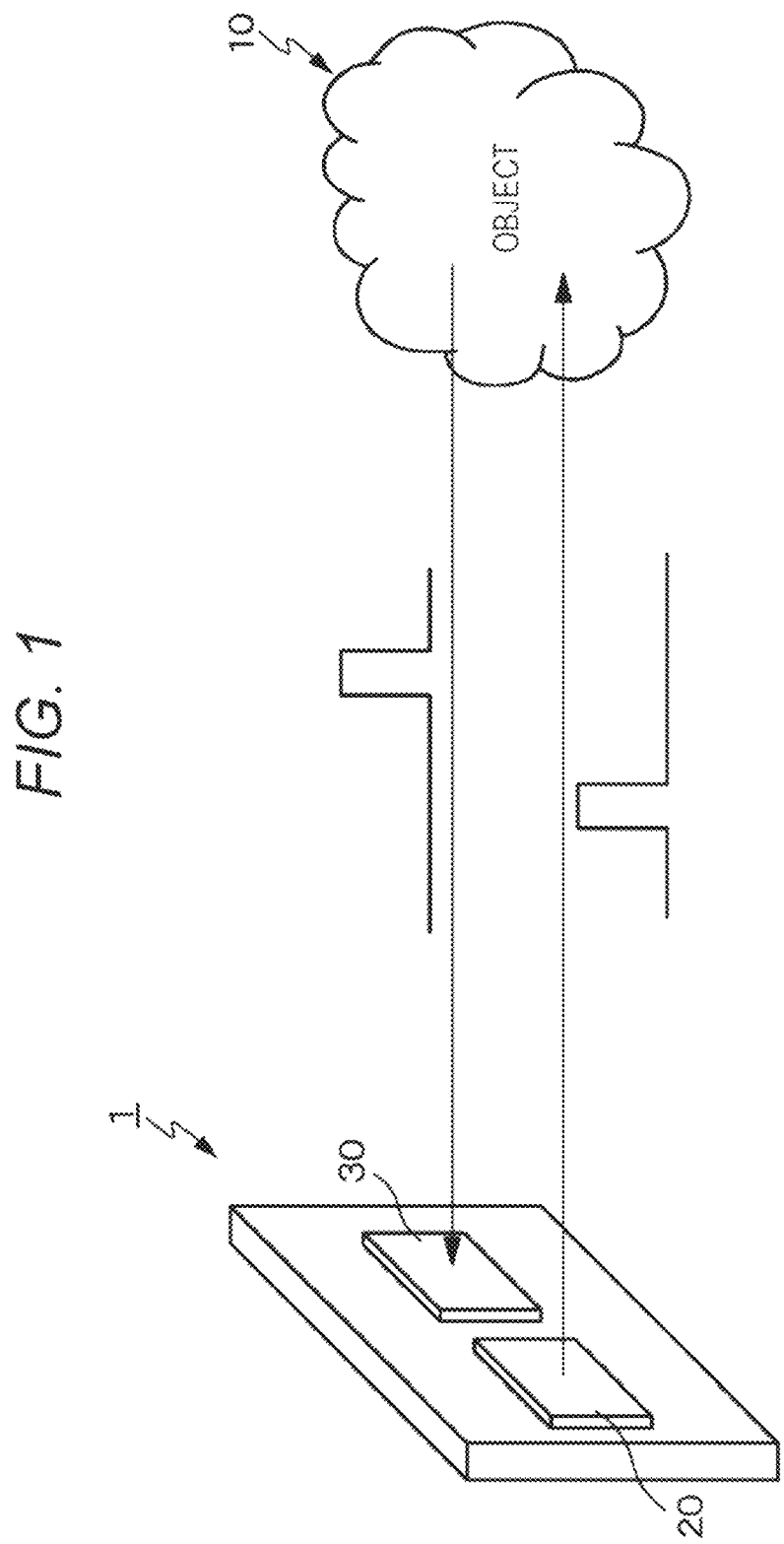

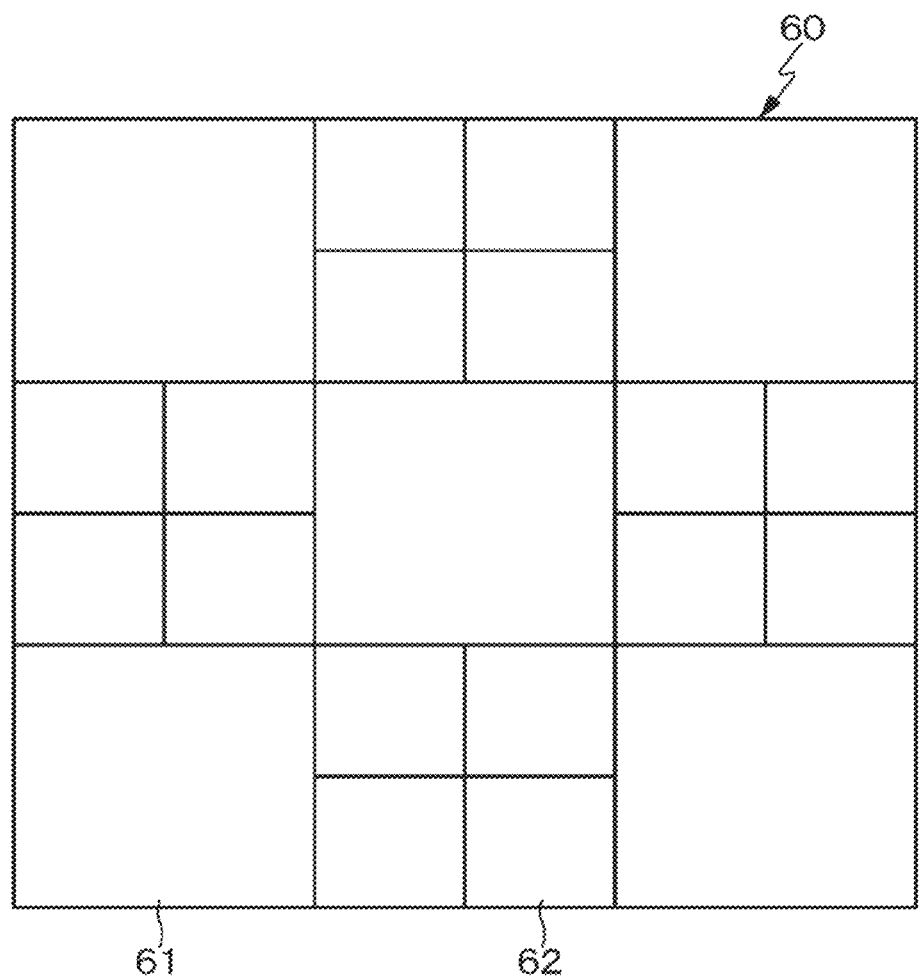

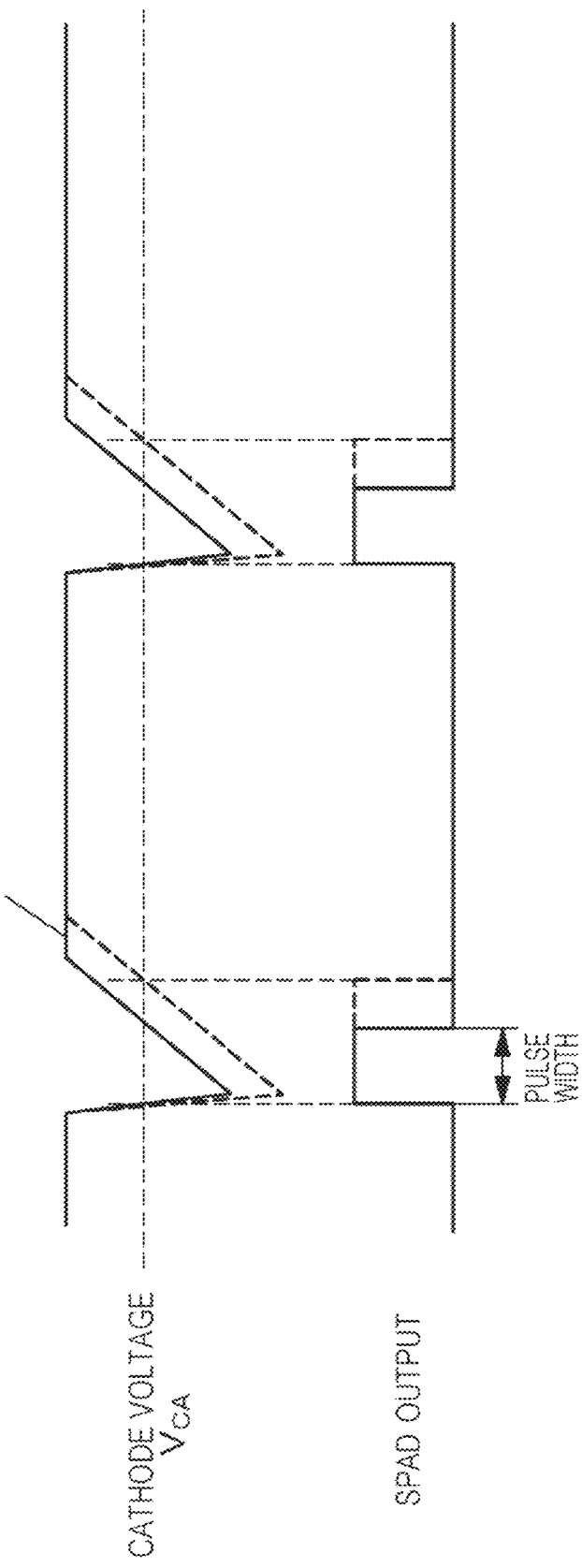

LIGHT RECEPTION DEVICE AND DISTANCE MEASUREMENT DEVICE

CROSS-REFERENCE TO RELATED APPLICATIONS

This application claims the benefit under 35 U.S.C. § 371 as a U.S. National Stage Entry of International Application No. PCT/JP2019/015423, filed in the Japanese Patent Office as a Receiving Office on Apr. 9, 2019, which claims priority to Japanese Patent Application Number JP 2018-081068, filed in the Japanese Patent Office on Apr. 20, 2018, each of which is hereby incorporated by reference in its entirety.

TECHNICAL FIELD

The present disclosure relates to a light reception device and a distance measurement device.

BACKGROUND ART

A distance measurement device includes, as a light reception unit, an element configured to generate a signal in response to photon light reception (refer to PTL 1, for example). Such a distance measurement device according to a conventional technology has a dynamic range increased by contriving signal processing of a histogram obtained by accumulating results of measurement of the time of flight (TOF) over a predetermined measurement time. Specifically, the number of pulses is detected in a case of a low light quantity, and a pulse width is detected in a case of a large light quantity.

CITATION LIST

Patent Literature

PTL 1: JP 2014-81254A

SUMMARY

Technical Problem

The present disclosure is intended to provide a light reception device capable of increasing a dynamic range without contriving histogram signal processing, and a distance measurement device including the light reception device.

Solution to Problem

According to the present disclosure, there is provided a light reception device. The light reception device comprises a pixel array including a plurality of pixels, each of the plurality of pixels including a photosensitive element configured to generate a signal in response to detection of a photon by the photosensitive element, wherein the plurality of pixels include a first pixel having a first sensitivity to detect a first photon incident on the first pixel and a second pixel having a second sensitivity to detect a second photon incident on the second pixel, wherein the second sensitivity is lower than the first sensitivity.

According to the present disclosure, there is provided a light reception system. The light reception system comprises a light source configured to irradiate a measurement object with light, and a light reception device configured to receive light reflected by the measurement object, wherein the light reception device includes a pixel array including a plurality of pixels each including a photosensitive element configured to generate a signal in response to detecting at least one photon incident on the photosensitive element, and the pixel array unit includes a first pixel having a first sensitivity to detect a first photon incident on the first pixel and a second pixel having a second sensitivity to detect a second photon incident on the second pixel, wherein the second sensitivity is lower than the first sensitivity.

Advantageous Effects of Invention

According to an embodiment of the present disclosure, dynamic range increase can be achieved without contriving histogram signal processing.

Note that the present technology is not necessarily limited to the above-described effect, but may achieve any effect disclosed in the present specification. In addition, the effects disclosed in the present specification are merely exemplary, and the present technology is not limited thereto, but may achieve additional effects.

BRIEF DESCRIPTION OF DRAWINGS

FIG. 1 is a schematic configuration diagram illustrating a distance measurement device according to an embodiment of the present disclosure.

FIG. 8 is a plan view illustrating a schematic configuration of a pixel array unit according to Example 1.

FIG. 1A is a plan view illustrating a schematic configuration of a pixel array unit according to Example 3.

FIG. 11 is a waveform diagram for description of the sensitivity of the SPAD element in a case where the excess bias voltage $V_{EX}$ is set to be small.

DESCRIPTION OF EMBODIMENTS

Figure 2A:
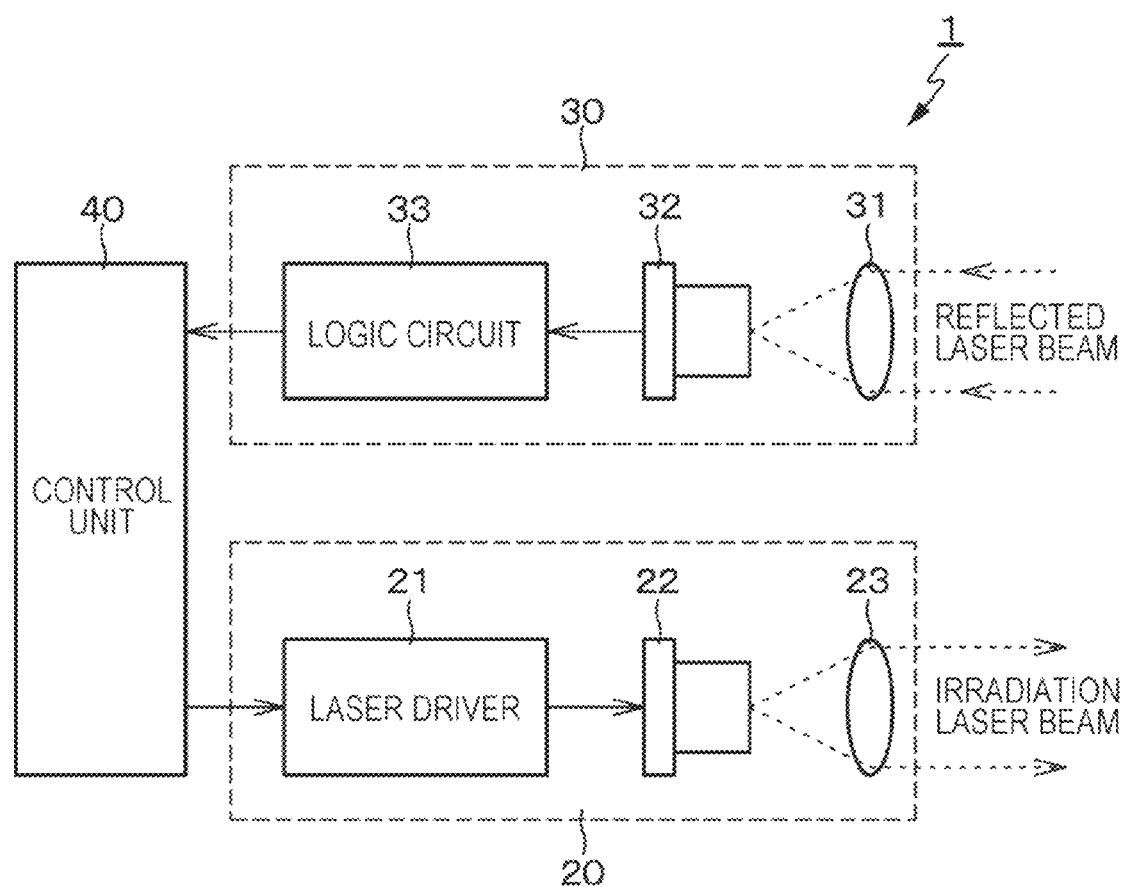
FIGS. 2A and 2B are each a block diagram illustrating a specific configuration of the distance measurement device according to the embodiment of the present disclosure.

The following describes a mode (hereinafter referred to as an "embodiment") for carrying out the technology of the present disclosure in detail with reference to the accompanying drawings. The technology of the present disclosure is not limited to the embodiment, and various kinds of values and the like in the embodiment are exemplary. In the following description, identical elements or elements having identical functions are denoted by an identical reference sign, and any duplicate description thereof will be omitted. Note that the description will be given in the following order.
1. General description of light reception device and distance measurement device according to embodiment of the present disclosure
2. Distance measurement device according to embodiment
2-1. Basic configuration of light reception device including SPAD element
2-2. Dead time DT of SPAD element
3. Light reception device according to embodiment
3-1. Example 1 (example in which light reception area is changed)
3-2. Example 2 (example in which semiconductor layer thickness is changed)
3-3. Example 3 (example in which excess bias voltage is changed)
3-4. Example 4 (modification of Example 3: example in which excess bias voltage is adjusted)
4. Exemplary application (exemplary moving object) of technology according to embodiment of the present disclosure
5. Configurations of the present disclosure <General Description of Light Reception Device and Distance Measurement Device According to Embodiment of the Present Disclosure>

In a light reception device and a distance measurement device according to an embodiment of the present disclosure, a first sensitivity may be a sensitivity that allows detection of incident light having an intensity lower than a predetermined light intensity, and a second sensitivity may be a sensitivity with which saturation is not reached at or below a predetermined light quantity.

In the light reception device and the distance measurement device of the present disclosure, having the above-described preferable configuration, the light reception area of a pixel having the first sensitivity may be larger than the light reception area of a pixel having the second sensitivity, and the thickness of a semiconductor layer of a light reception unit of the pixel having the first sensitivity may be larger than the thickness of a semiconductor layer of a light reception unit of the pixel having the second sensitivity.

In addition, in the light reception device and the distance measurement device of the present disclosure, having the above-described preferable configuration, the voltage value of excess bias voltage of the pixel having the first sensitivity may be higher than the voltage value of excess bias voltage of the pixel having the second sensitivity. In this case, the voltage value of the excess bias voltage may be set by the voltage value of anode voltage applied to an anode electrode of the light reception unit. In addition, the voltage value of the anode voltage may be set in accordance with an intensity of ambient light.

In addition, in the light reception device and the distance measurement device of the present disclosure, having the above-described preferable configuration, the light reception unit may include a single photon avalanche diode.

<Distance Measurement Device According to Embodiment>

FIG. 1 is a schematic configuration diagram illustrating a distance measurement device according to an embodiment of the present disclosure. This distance measurement device 1 according to the present embodiment employs, as a measurement method of measuring the distance to an object 10 as a measurement object, a time-of-flight (TOF) method of measuring a time until light (for example, laser beam) emitted toward the object 10 returns after reflection at the object 10. To achieve distance measurement by the TOF method, the distance measurement device 1 according to the present embodiment includes a light source 20 and a light reception device 30. In addition, the light reception device 30 is a light reception device according to the embodiment of the present disclosure as described later.

Figure 2B:
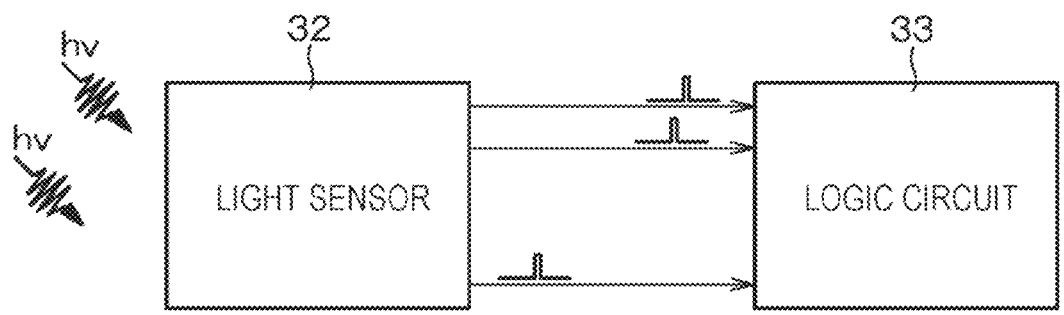

FIGS. 2A and 2B illustrate a specific configuration of the distance measurement device 1 according to the present embodiment. The light source 20 includes, for example, a laser driver 21, a laser light source 22, and a diffusion lens 23, and emits a laser beam to the object 10. The laser driver 21 drives the laser light source 22 under control of a control unit 40. The laser light source 22 includes, for example, a semiconductor laser, and is driven by the laser driver 21 to emit a laser beam. The diffusion lens 23 diffuses the laser beam emitted from the laser light source 22, and emits the diffused laser beam to the object 10.

The light reception device 30 includes a light reception lens 31, a light sensor 32, and a logic circuit 33, and receives an irradiation laser beam emitted from a laser irradiation unit 20 and returning as a reflected laser beam after reflection at the object 10. The light reception lens 31 condenses the reflected laser beam from the object 10 onto a light reception surface of the light sensor 32. The light sensor 32 receives, at each pixel, the reflected laser beam from the object 10 through the light reception lens 31, and photoelectrically converts the laser beam.

An output signal from the light sensor 32 is supplied to the control unit 40 through the logic circuit 33. The light sensor 32 will be described later in detail. The control unit 40 is achieved by, for example, a central processing unit (CPU) or the like, controls the light source 20 and the light reception device 30, and measures a time t until a laser beam emitted from the light source 20 toward the object 10 returns after reflection at the object 10. A distance L to the object 10 can be calculated based on the time t. The time t is measured by a method of starting a timer at a timing when pulse light is emitted from the light source 20 and stopping the timer at a timing when the pulse light is received by the light reception device 30. In another time measurement method, a pulse light may be emitted from the light source 20 in a predetermined period, a period may be detected when the pulse light is received by the light reception device 30, and the time t may be measured based on the phase difference between the light emission period and the light reception period. The time measurement is executed a plurality of times, and the time t is measured by detecting a peak of a histogram obtained by accumulating the times measured the plurality of times.

The light sensor 32 may be a two-dimensional array sensor (what is called area sensor) in which pixels each including a light reception unit are disposed in a two-dimensional array, or may be a one-dimensional array sensor (what is called a line sensor) in which pixels each including a light reception unit are disposed straight.

In addition, in the present embodiment, the light sensor 32 is a sensor in which the light reception unit of each pixel includes an element configured to generate a signal in response to photon light reception, such as a single photon avalanche diode (SPAD) element. Specifically, the light reception device 30 according to the present embodiment has a configuration in which the light reception unit of each pixel includes the SPAD element. Note that the light reception unit is not limited to the SPAD element, but may be one of various kinds of elements such as an avalanche photo diode (APD) and a current assisted photonic demodulator (CAPD).

Figure 3A:
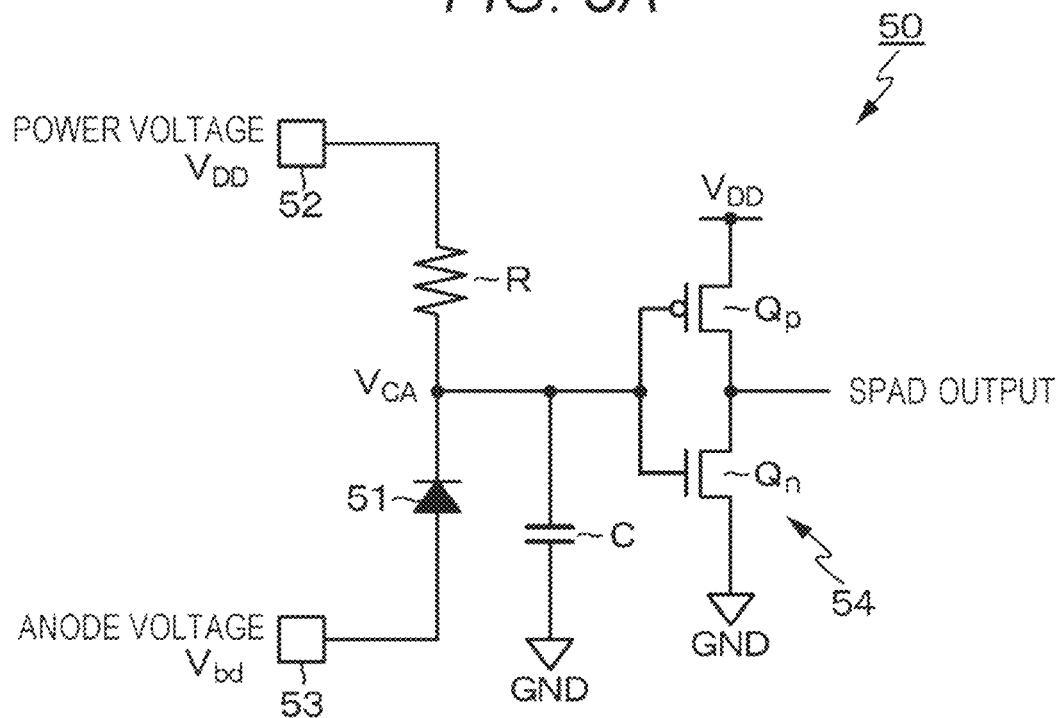
FIG. 3A is a circuit diagram illustrating a first example of a basic pixel circuit of a light reception device including an SPAD element.
Figure 3B:
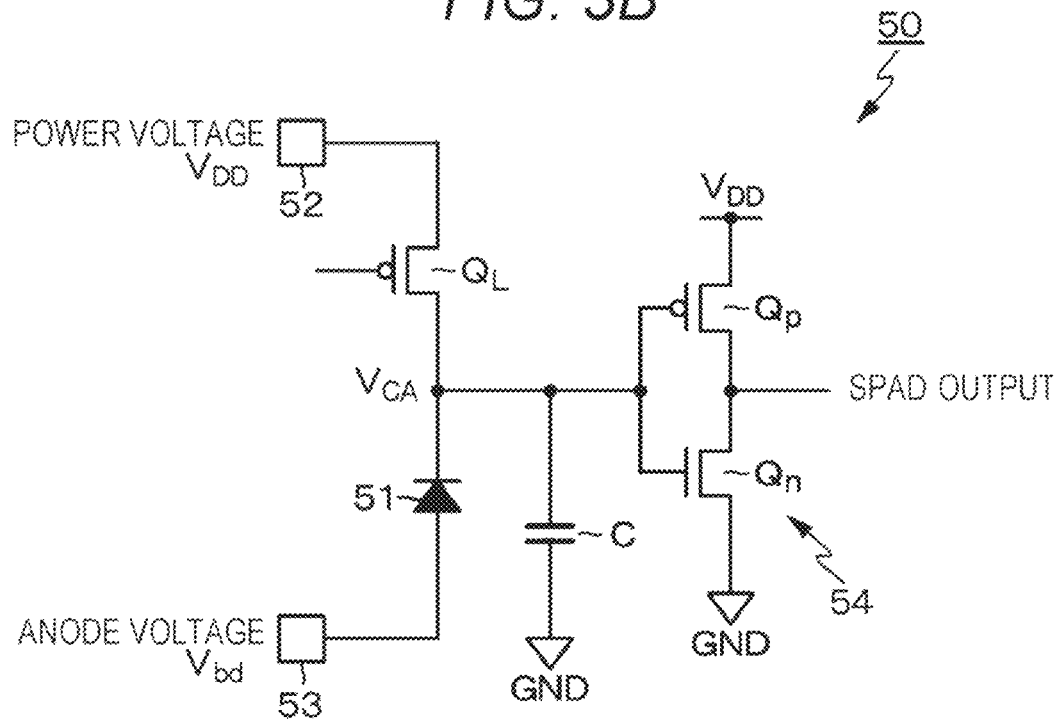
FIG. 3B is a circuit diagram illustrating a second example of the basic pixel circuit of the light reception device including the SPAD element.

(Basic circuit of light reception device including SPAD element) FIG. 3A illustrates a first example of a basic pixel circuit of the light reception device 30 including the SPAD element, and FIG. 3B illustrates a second example thereof. Here, each drawing illustrates the basic configuration of one pixel.

In a pixel circuit 50 according to the first example, a SPAD element 51 has a cathode electrode connected with a terminal 52 provided with a power voltage $V_{DD}$ through a resistance element R as a load, and an anode electrode connected with a terminal 53 provided with an anode voltage $V_{bd}$. A terminal 52 and a terminal 53 are coupled to a voltage source to provide a power voltage $V_{DD}$ and an anode voltage $V_{bd}$ respectively. The anode voltage $V_{bd}$ is a large negative voltage that causes avalanche multiplication. A capacitor element C connects the anode electrode and the ground. In addition, a cathode voltage $V_{CA}$ of the SPAD element 51 is derived as a SPAD output (pixel output) through a CMOS inverter 54 including a P-type MOS transistor $Q_p$ and a N-type MOS transistor $Q_n$ connected in series with each other.

Figure 4A:
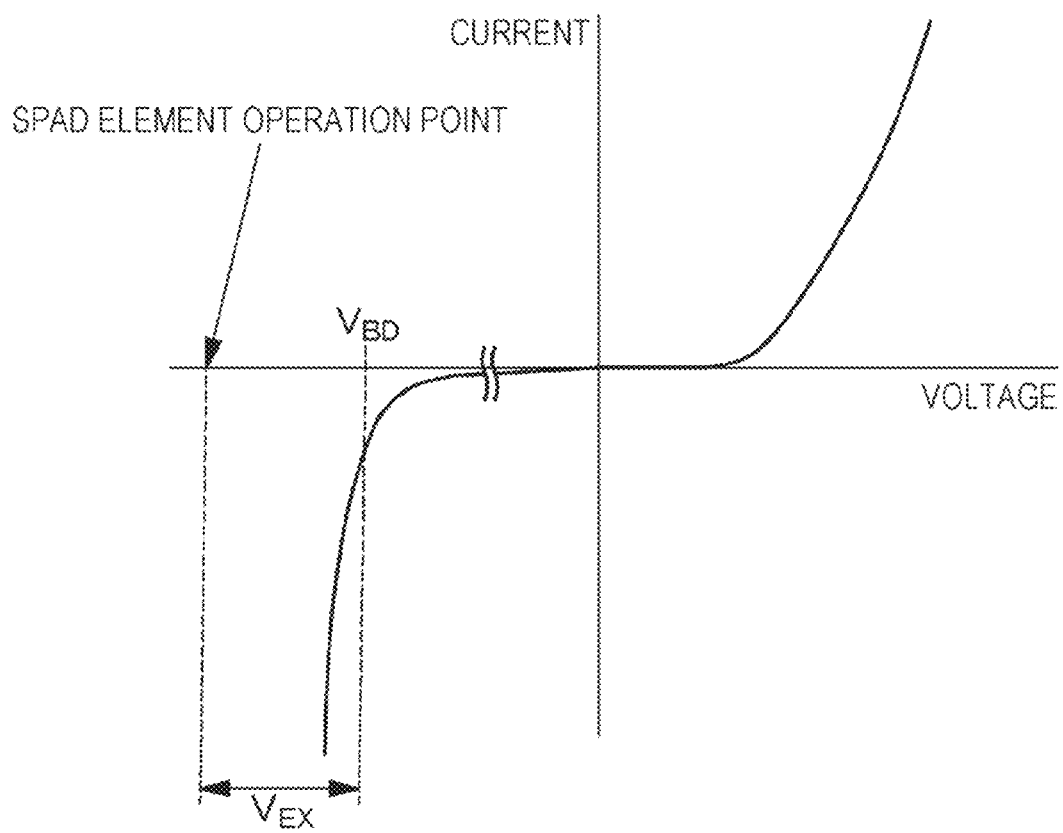
FIG. 4A is a characteristic diagram illustrating a current-voltage characteristic of a PN junction of the SPAD element.

The SPAD element 51 is provided with a voltage equal to or higher than a breakdown voltage $V_{BD}$. An excessive voltage equal to or higher than the breakdown voltage $V_{BD}$ is referred to as an excess bias voltage $V_{EX}$, and is typically 2 to 5 V approximately. The SPAD element 51 operates in a region called Geiger mode in which there is no stable DC point. FIG. 4A illustrates an I (current)-V (voltage) characteristic of the PN junction of the SPAD element 51.

The pixel circuit 50 according to the second example is different from the first example in that the resistance element R as a load in the pixel circuit 50 according to the first example is replaced with a P-type MOS transistor $Q_L$. The other circuit configuration is basically same.

Figure 4B:
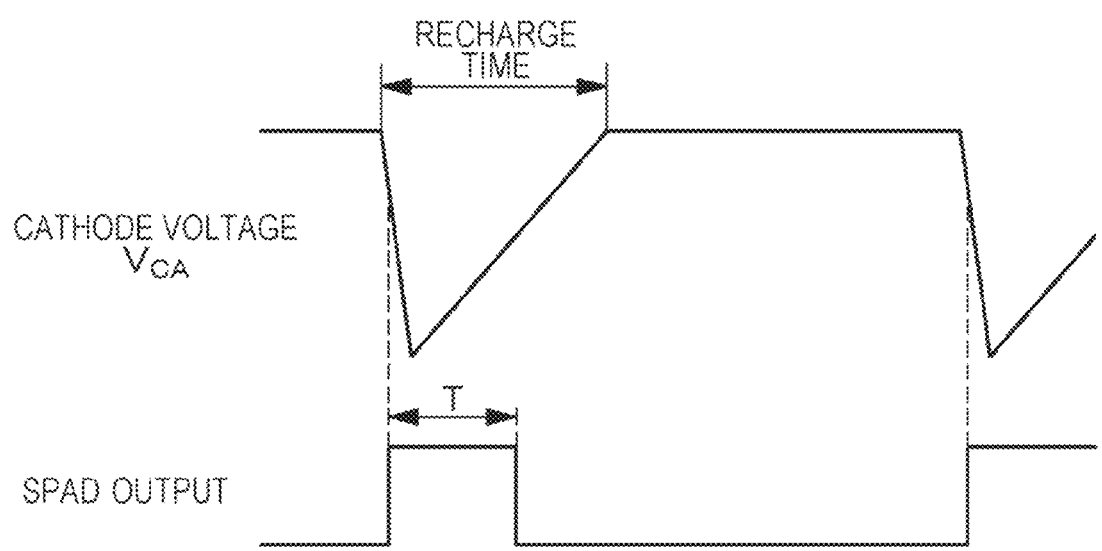
FIG. 4B is a waveform diagram for description of a circuit operation of the pixel circuit.

Subsequently, a circuit operation of the pixel circuit 50 configured as described above will be described with reference to a waveform diagram illustrated in FIG. 4B.

In a state in which no current flows through the SPAD element 51, a voltage of $V_{DD}V_{bd}$ is applied to the SPAD element 51. The voltage value ($V_{DD}-V_{bd}$) is ($V_{BD}+V_{EX}$). Then, the dark electron generation rate DCR (dark count rate) and electrons generated by the light irradiation cause avalanche multiplication at the PN junction part of the SPAD element 51, thereby generating avalanche current. This phenomenon occurs stochastically even in a light-shielded state (in which no light is incident). This is the dark electron generation rate DCR.

When the cathode voltage $V_{CA}$ decreases and the voltage between the terminals of the SPAD element 51 becomes the breakdown voltage $V_{BD}$ of a PN diode, the avalanche current stops. Then, electrons generated and accumulated at the avalanche multiplication are discharged through the resistance element R (or the P-type MOS transistor $Q_L$) as a load, and the cathode voltage $V_{CA}$ recovers to the power supply voltage $V_{DD}$, and returns to the initial state. This operation is a so-called quenching operation.

When light is incident on the SPAD element 51 and at least one pair of an electron and a hole is generated, the pair generates avalanche current. Thus, even the incidence of one photon can be detected at a certain probability PDE (photon detection efficiency). The probability PDE of detecting this photon is usually about several % to 20% approximately.

The above-described operation is repeated. In addition, in this series of operations, the cathode voltage $V_{CA}$ is waveform-shaped by the CMOS inverter 54, and a pulse signal having a pulse width T with the arrival time of one photon as a start point is obtained as the SPAD output (pixel output).

As described above, the SPAD element 51 is a high-performance light sensor capable of detecting the incidence of a single photon at a certain probability PDE. However, after having performed photon detection once, the SPAD element 51 has a period of time during which the SPAD element 51 cannot react to photons, that is, a dead time Dead Time (DT) for several ns to several tens ns. Accordingly, when a large light quantity condition is satisfied so that the detection frequency of photons is increased, the total duration of the dead time DT becomes too long to ignore with respect to the observation time, and the accuracy of light detection decreases.

(Dead Time DT During which No Reaction to Photon is Possible)

Figure 5:
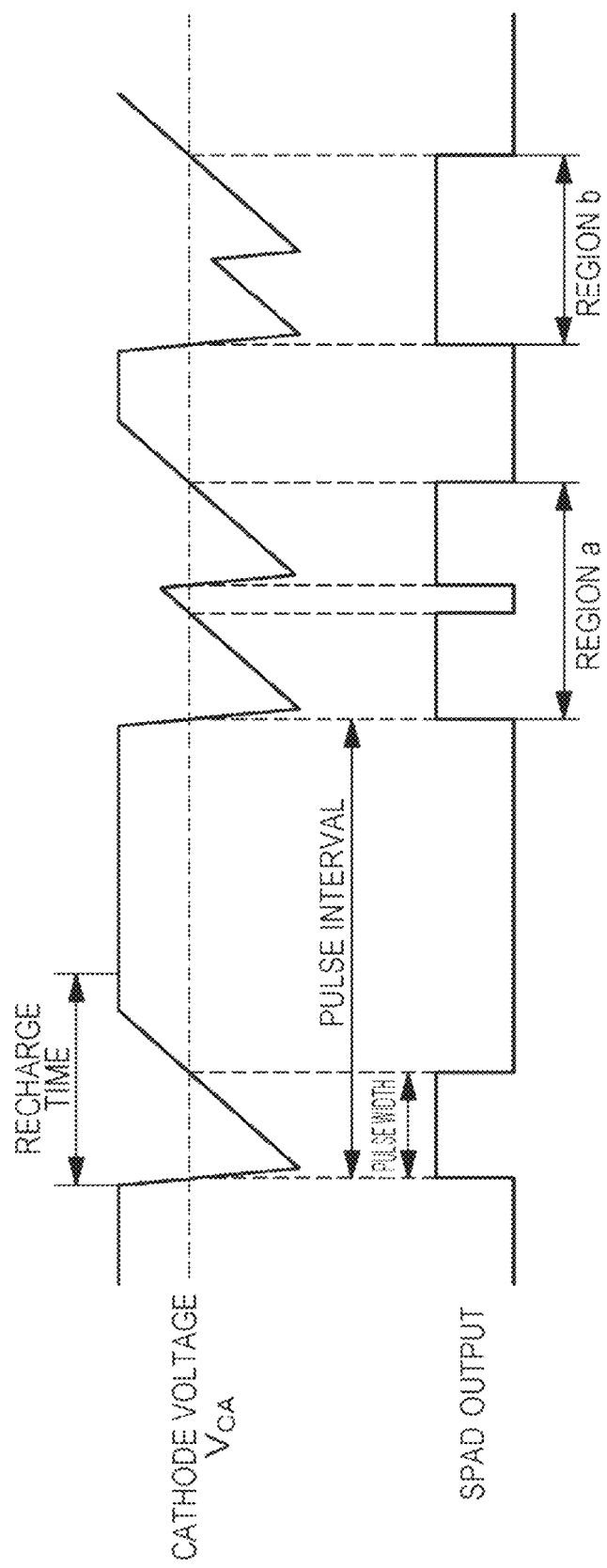
FIG. 5 is a waveform diagram for description of a dead time DT of the SPAD element in a case of a relatively small irradiation light quantity.

The following more specifically describes the dead time DT during which the SPAD element 51 cannot react to photons with reference to a waveform diagram in FIG. 5. As described above, the SPAD element 51 has the dead time DT during which no reaction to light incidence is possible, which is attributable to a time in which the cathode voltage $V_{CA}$ recovers to the power voltage $V_{DD}$. For example, in Region a, avalanche multiplication occurs twice, and accordingly, two pulse signals are generated as the SPAD output. However, in Region b, avalanche multiplication occurs twice, but only one pulse signal is generated.

Theoretically, the SPAD element 51 generates no SPAD output for light incidence occurred until the cathode voltage $V_{CA}$ becomes a voltage equal to or higher than a threshold voltage of the CMOS inverter 54 at the next stage since the SPAD element 51 reacts once. Thus, this duration is the dead time DT, and the pulse width T is a threshold value.

Figure 6:
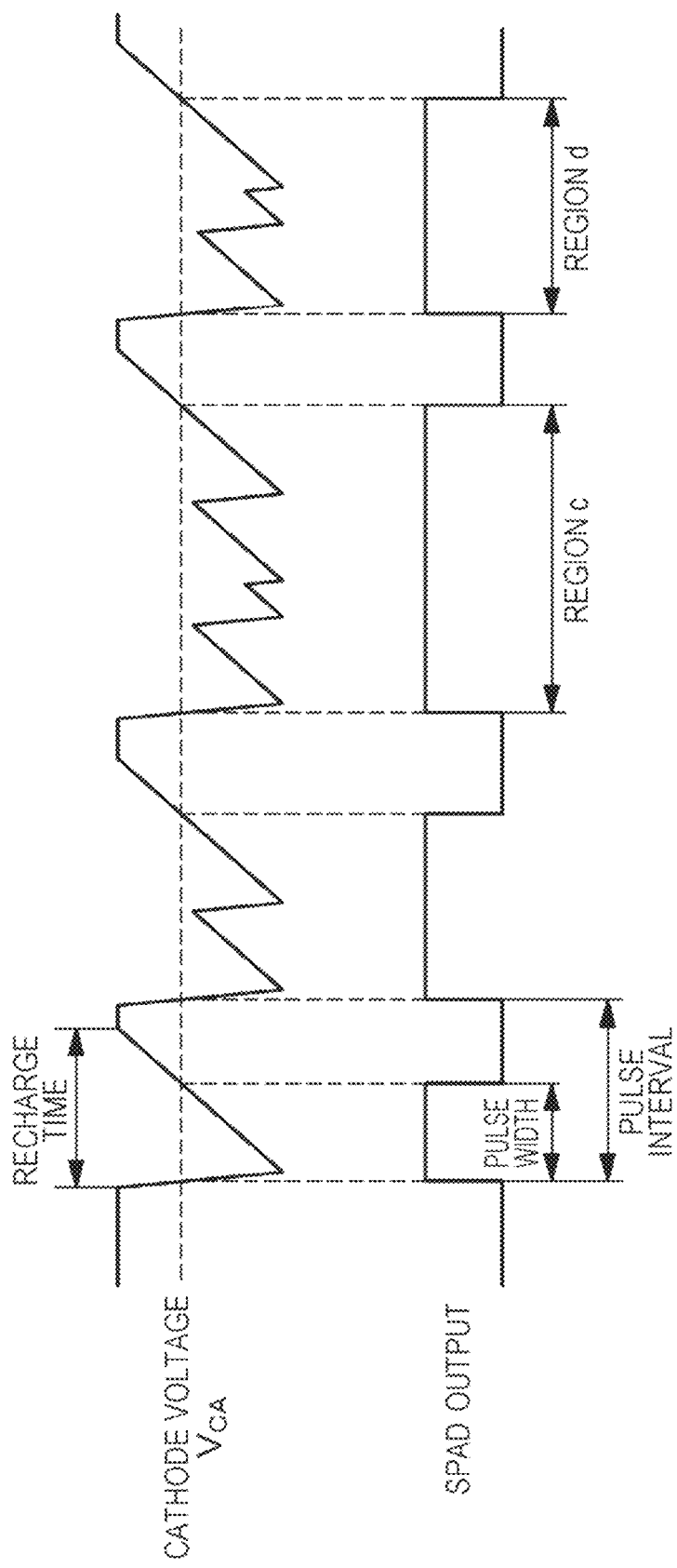
FIG. 6 is a waveform diagram for description of the dead time DT of the SPAD element in a case of a relatively large irradiation light quantity.

In the case of FIG. 5, the irradiation light quantity on the SPAD element 51 is relatively small. In a case where the irradiation light quantity is relatively large and the light reaction number is large, the actual number of responses of the SPAD element 51 increases in Regions c and d as illustrated in FIG. 6, but missing of pulse signal counting due to the influence of the dead time DT is largely affected. This phenomenon becomes more significant under a condition of a long dead time DT and a high photon detection probability PDE.

A more detailed logical expression is given below. In the following expression, m is a pulse signal count value, n is an ideal response frequency to incident light quantity, and $t_{dead}$ is a time of the dead time DT.

$$m = n \cdot \exp(-n \cdot t_{dead})$$

Deviation from the theoretical expression is larger as the time $t_{dead}$ of the dead time DT is longer and the ideal response frequency n relative to the incident light quantity is larger.

Figure 7A:
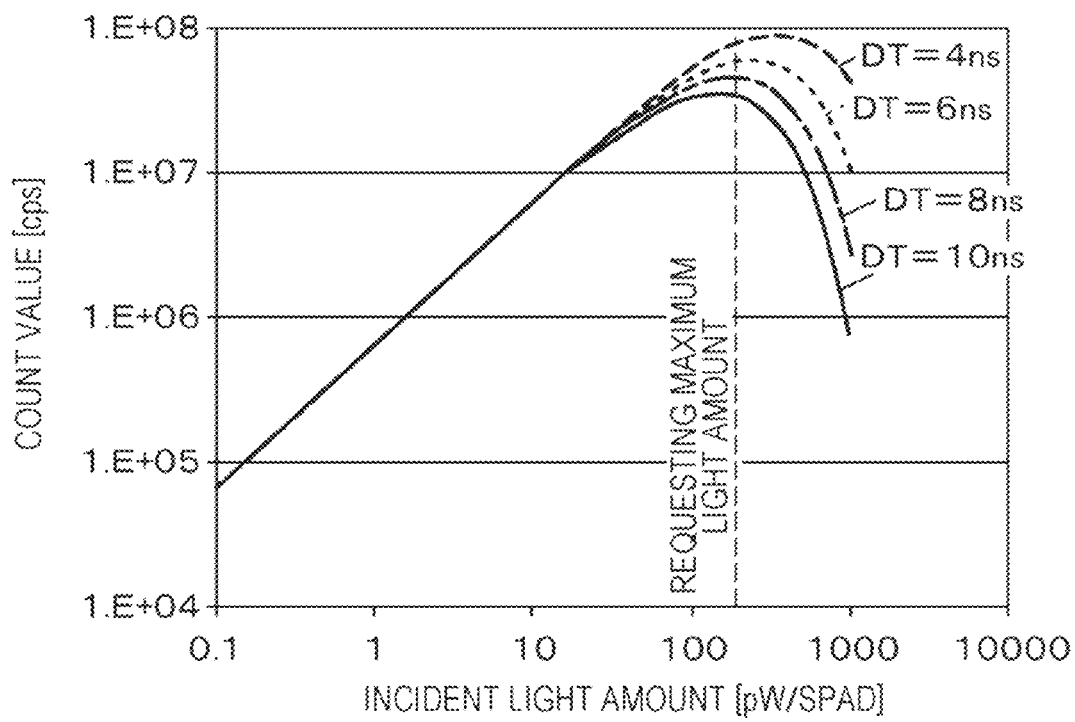
FIG. 7A is a characteristic diagram illustrating the relation between the dead time DT and an incident light quantity-count value characteristic.
Figure 7B:
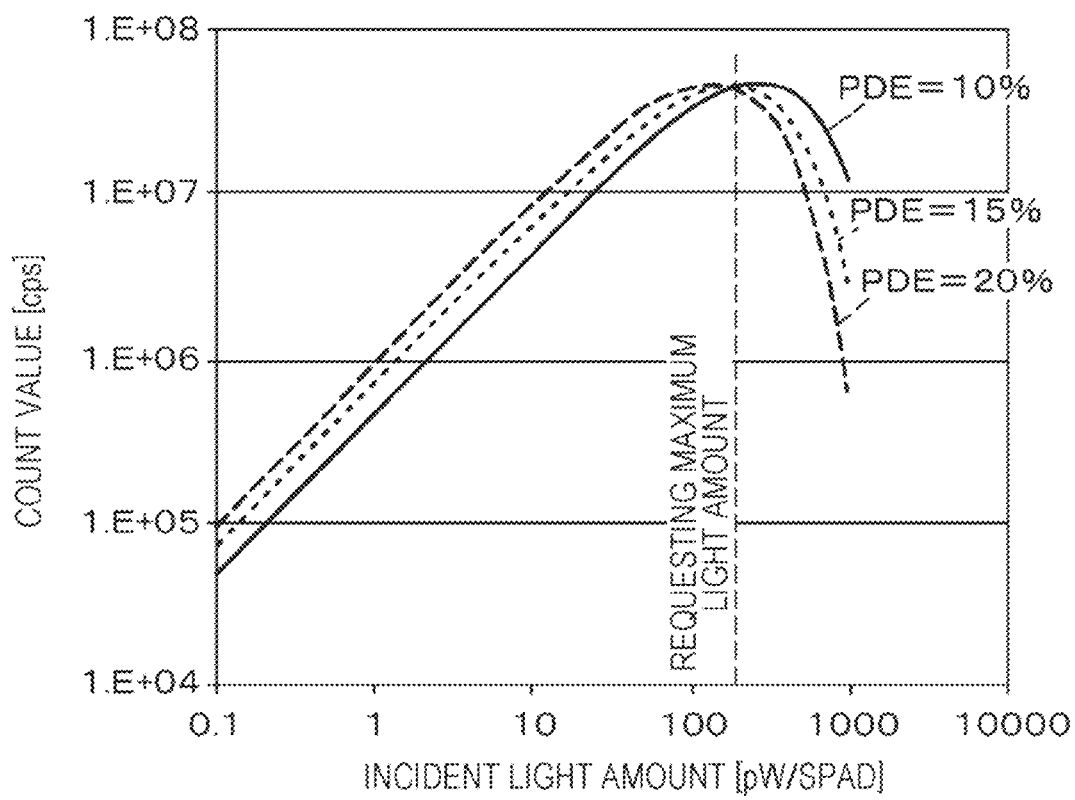
FIG. 7B is a characteristic diagram illustrating the relation between a photon detection probability PDE and the incident light quantity-count value characteristic.

The ideal characteristic of the SPAD element 51 is that the pulse signal count value m linearly changes relative to the incident light quantity. However, a sample with a larger dead time DT tends to reach saturation with weaker incident light as illustrated in FIG. 7A. This tendency is more likely to occur to a SPAD with a higher photon detection probability PDE (in other words, a SPAD with a higher sensitivity) as illustrated in FIG. 7B. Thus, the characteristic illustrated in FIG. 7B indicates that a SPAD with a higher sensitivity tends to reach saturation faster.

Incidentally, as described later, the distance measurement device 1 including the light reception device 30 in which the SPAD element 51 is used as the light sensor 32 can be mounted and used on a moving object such as an automobile. For example, in automatic operation of an automobile, the car is required to be able to detect an obstacle 300 m ahead through irradiation with a laser beam having a limit on the maximum light quantity by regulation. Thus, the sensitivity of the SPAD element 51 needs to be high. However, the SPAD element 51 needs to operate normally even under conditions of morning sun, strong reflected light, or the like, and should not reach saturation at or below a customer requesting maximum light quantity illustrated in FIGS. 7A and 7B. Thus, the light reception device 30 in which the SPAD element 51 is used as the light sensor 32 is required to operate in a high dynamic range, in other words, to be able to react with weak incident light but not reach saturation with strong incident light.

<Light Reception Device According to Embodiment>

In the present embodiment, to increase the dynamic range, in the light reception device 30 including a pixel array unit including a plurality of pixels each including the SPAD element 51, the pixel array unit includes a pixel (what is called high-sensitivity pixel) having the first sensitivity, and a pixel (what is called low-sensitivity pixel) having the second sensitivity lower than the first sensitivity. Accordingly, the high-sensitivity pixel reacts to weak incident light and the low-sensitivity pixel reacts to strong incident light, which results in increase of the dynamic range.

The sensitivity (that is, the first sensitivity) of the high-sensitivity pixel may be a sensitivity that allows detection of incident light (photons in an amount smaller than a predetermined amount) having an intensity lower than a predetermined light intensity. In addition, the sensitivity (that is, the second sensitivity) of the low-sensitivity pixel is preferably a sensitivity with which saturation is not reached at or below a predetermined light quantity, specifically, at or below the customer requesting maximum light quantity illustrated in FIGS. 7A and 7B.

In this example, the pixel sensitivity is set to two stages at the first sensitivity and the second sensitivity, but the present technology is not limited to setting of sensitivities at two stages. One or both of the first sensitivity and the second sensitivity may be further subdivided into a set of sensitivities at three or more stages.

The following describes specific examples of the present embodiment for increasing the dynamic range.

Example 1

Example 1 is an example in which the dynamic range is increased by changing the size of each pixel in the pixel array unit. FIG. 8 illustrates a schematic configuration of the pixel array unit according to Example 1.

In Example 1, a pixel array unit 60 in which pixels are two-dimensionally disposed in a matrix includes a first pixel 61 having a relatively large pixel size, and a second pixel 62 having a pixel size smaller than that of the first pixel 61.

Note that this example exemplarily describes a pixel arrangement in which the first pixel 61 and the four second pixels 62 disposed in a region having a size equal to that of the first pixel 61 are arranged in a lattice. However, the present technology is not limited to this pixel arrangement, but is basically applicable to any pixel arrangement in which the first pixel 61 and the second pixel 62 are mixed in the pixel array unit 60.

The difference between the pixel sizes of the first pixel 61 and the second pixel 62 means that the light reception areas of the first pixel 61 and the second pixel 62 are different from each other. Specifically, as apparent from FIG. 8, the light reception area of the first pixel 61 is larger than that of the second pixel 62. Accordingly, the first pixel 61 has a sensitivity higher than that of the second pixel 62.

As described above, the light reception device 30 according to Example 1 includes, in the pixel array unit 60, the first pixel 61 having a relatively large pixel size (light reception area), and the second pixel 62 having a relatively small pixel size (light reception area). With this configuration, photons can be reliably detected by the first pixel 61 under a condition of a low incident light quantity, and detection operation can be performed by the second pixel 62 without saturation under a condition of a high incident light quantity. As a result, the dynamic range of the light reception device 30 is increased.

Exemplary Applications of Example 1

Example 1 may have exemplary applications as follows.

Exemplary Application 1

The outputs of the first pixel 61 and the second pixel 62 may be weighted in accordance with the pixel sizes and summed to perform light quantity determination. A distance measurement device, such as a light detection and ranging, laser imaging detection and ranging (LIDAR) device, mounted on a moving object such as an automobile has the function of recognizing an object (for example, the function of recognizing a white line on a road) by determining the light quantity of reflected light in addition to the function of calculating the distance to the object by measuring a time until a laser beam returns after reflection at the object. Such functions need determination of the light quantity of reflected light, and thus a result of the determination can be used to weight the outputs of the first pixel 61 and the second pixel 62 in accordance with the pixel sizes (light reception areas) and determine the light quantity of reflected light based on the sum thereof.

Exemplary Application 2

Only a pixel (the first pixel 61 or the second pixel 62) having either pixel size may be operated depending on the intensity (light quantity) of ambient light. A distance measurement device such as a LIDAR device mounted on a moving object such as an automobile has a preparation mode in which the degree of ambient light is determined in a non-light emission state before emission of a laser beam. A result of determination in the preparation mode can be used to determine on the basis of the intensity of ambient light whether to use the first pixel 61 having a large pixel size or the second pixel 62 having a small pixel size.

Exemplary Application 3

The first pixel 61 having a relatively large pixel size and the second pixel 62 having a relatively small pixel size may be selectively used in a temporally sequential manner. For example, the first pixel 61 having a large pixel size and the second pixel 62 having a small pixel size may be alternately operated, or whether to use the first pixel 61 having a large pixel size or the second pixel 62 having a small pixel size may be determined on the basis of a previous evaluation result.

Example 2

Figure 9A:
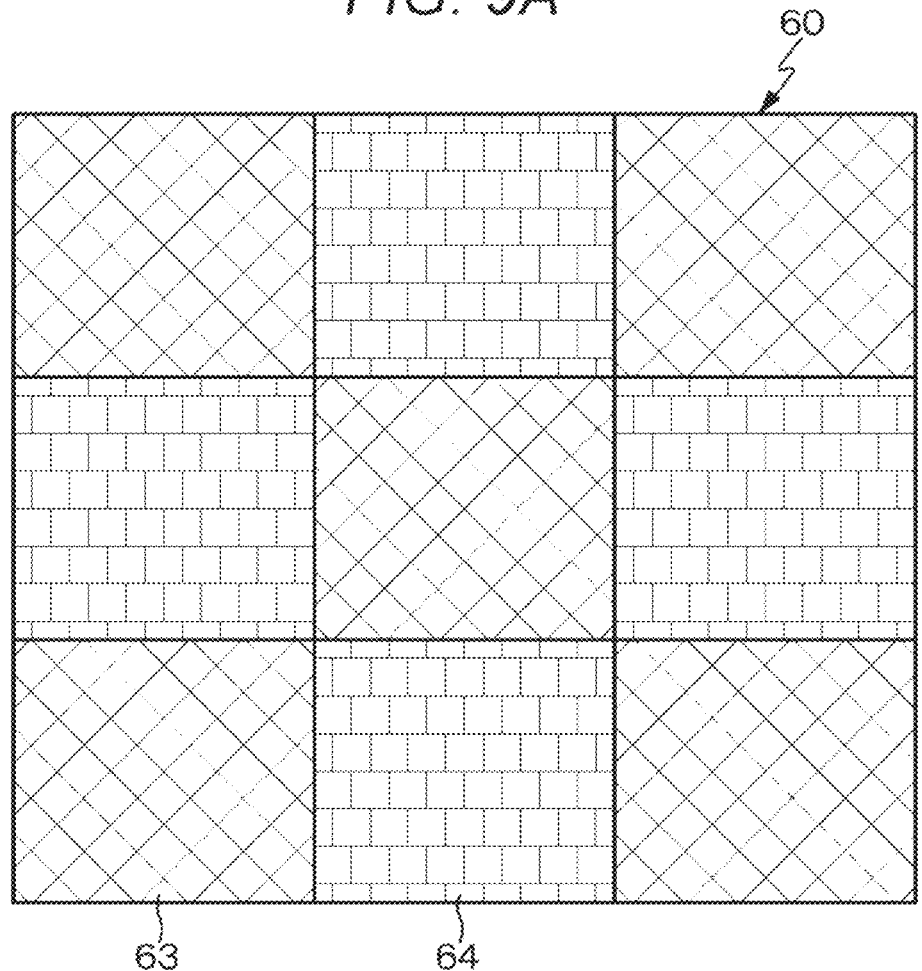
FIG. 9A is a plan view illustrating a schematic configuration of a pixel array unit according to Example 2.

Example 2 is an example in which the dynamic range is increased by changing the thickness of the semiconductor layer of the light reception unit of a pixel. FIG. 9A illustrates a schematic configuration of the pixel array unit according to Example 2, and FIG. 9B illustrates a sectional structure of the light reception unit.

Figure 9B:
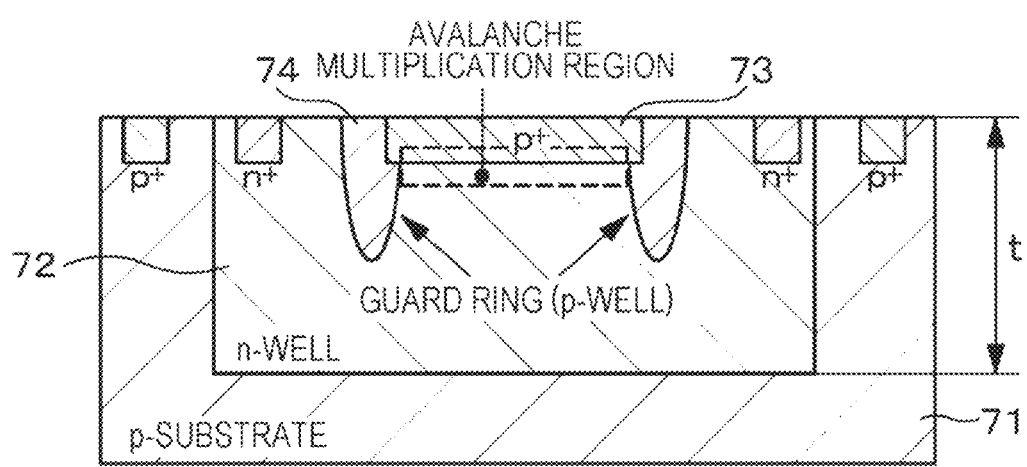
FIG. 9B is a cross-sectional view illustrating a sectional structure of a light reception unit.

As illustrated in FIG. 9B, a semiconductor substrate, for example, a p⁻ substrate 71 includes a SPAD element configured to cause avalanche multiplication through a pn junction between a n⁻ well 72 as a semiconductor layer and the bottom surface of a p⁺ diffusion layer 73. A guard ring of a p⁻ well 74 is formed at a peripheral part of the p⁺ diffusion layer 73. Accordingly, soft breakdown is prevented from occurring at a voltage lower than the breakdown voltage $V_{BD}$.

In the light reception unit having the above-described structure, electron-hole pairs are more likely to generate at light incidence in the SPAD element in which the n⁻ well 72 as a semiconductor layer has a larger thickness t, and thus the photon detection probability PDE and the sensitivity are high. Thus, in Example 2, a first pixel 63 having a relatively high sensitivity and a second pixel 64 having a relatively low sensitivity are provided in the pixel array unit 60 as illustrated in FIG. 9A by changing the thickness t of the n⁻ well 72 of the SPAD element.

Note that this example exemplarily describes a pixel arrangement in which the first pixel 63 as a high-sensitivity pixel and the second pixel 64 as a low-sensitivity pixel are arranged in a lattice. However, the present technology is not limited to this pixel arrangement, but is basically applicable to any pixel arrangement in which the first pixel 63 and the second pixel 64 are mixed in the pixel array unit 60.

When the high-sensitivity pixel and the low-sensitivity pixel are mixed in the pixel array unit 60, in Example 2, the thickness t of the n⁻ well 72 of the SPAD element is larger in the first pixel 63 as a high-sensitivity pixel than in the second pixel 64 as a low-sensitivity pixel.

As described above, the light reception device 30 according to Example 2 includes, in the pixel array unit 60, the first pixel 63 having a relatively large thickness t of the n⁻ well 72 and the second pixel 64 having a relatively small thickness t of the n⁻ well 72. With this configuration, the first pixel 63 can reliably detect photons under a condition of a small incident light quantity, and the second pixel 64 can perform the detection operation without reaching saturation under a condition of a large incident light quantity. As a result, the dynamic range of the light reception device 30 is increased.

Exemplary Applications of Example 2

Example 2 can be used in combination with the Example 1. Specifically, the light reception device 30 may include, in the pixel array unit 60, the first pixel 61 having a relatively large pixel size and the second pixel 62 having a relatively small pixel size in addition to the first pixel 63 having a relatively large thickness t of the n⁻ well 72 and the second pixel 64 having a relatively small thickness t of the n⁻ well 72.

In addition, Example 2 may have exemplary applications similar to Exemplary applications 1 to 3 of Example 1.

Exemplary Application 1

The outputs of the first pixel 63 and the second pixel 64 may be weighted in accordance with the thickness t of the n⁻ well 72 and summed to perform light quantity determination. Specific examples thereof are same as those in Exemplary application 1 of Example 1.

Exemplary Application 2

Only pixel (the first pixel 63 or the second pixel 64) having either thickness t of the n⁻ well 72 may be operated depending on the intensity (light quantity) of ambient light. Specific examples thereof are same as those in Exemplary application 2 of Example 1.

Exemplary Application 3

The first pixel 63 having a relatively large thickness t of the n well 72 and the second pixel 64 having a relatively small thickness t of the n⁻ well 72 may be selectively used in a temporally sequential manner. Specific examples thereof are same as those in Exemplary application 3 of Example 1.

Example 3

Figure 10A:
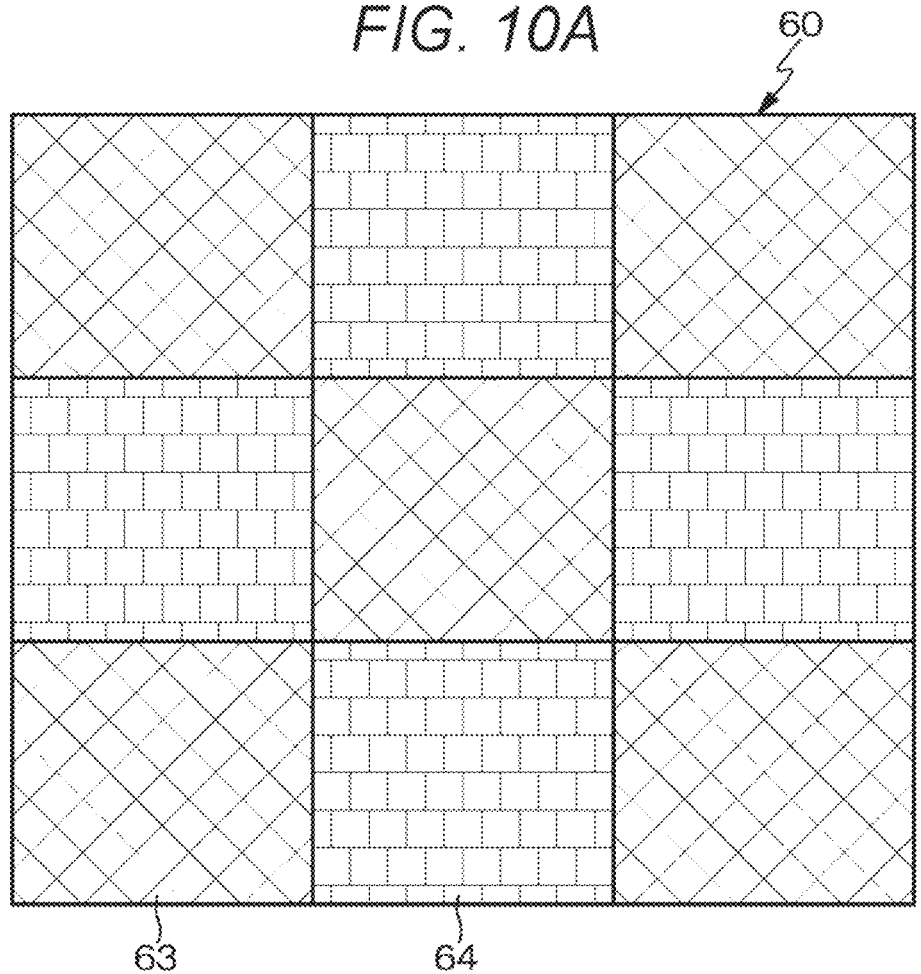
FIG. 10B is a characteristic diagram illustrating the relation between an excess bias voltage $V_{EX}$ and the probability PDE as a sensitivity index.

Example 3 is an example in which the dynamic range is increased by changing the light reception unit of a pixel, in other words, the excess bias voltage $V_{EX}$ of the SPAD element. The excess bias voltage $V_{EX}$ is an excessive voltage equal to or larger than the breakdown voltage $V_{BD}$ applied to the SPAD element. FIG. 10A illustrates a schematic configuration of the pixel array unit according to Example 3, and FIG. 10B illustrates the relation between the excess bias voltage $V_{EX}$ and the probability PDE as a sensitivity index.

Figure 10B:
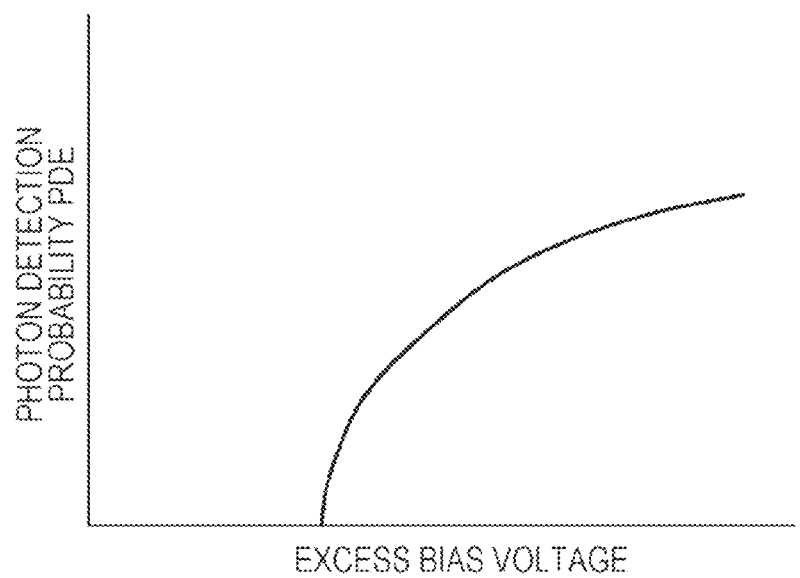

As apparent from FIG. 10B, the photon detection probability PDE, in other words, the sensitivity of the SPAD element can be reduced by decreasing the voltage value of the excess bias voltage $V_{EX}$, and thus light saturation is unlikely to occur under a condition of a large light quantity. In addition, when the voltage value of the excess bias voltage $V_{EX}$ is decreased, the pulse width of the SPAD output, in other words, the dead time DT during which no reaction to photons is possible is reduced as illustrated in FIG. 11, and thus the light saturation characteristic under a condition of a large light quantity can be improved based on the above-described theoretical expression.

The excess bias voltage $V_{EX}$, the photon detection probability PDE, the dead time DT during which no reaction to photons is possible, and the characteristic of the SPAD element have a relation as follows. Specifically, the SPAD element having a relatively high excess bias voltage $V_{EX}$, a relatively high probability PDE, and a relatively long dead time DT has a relatively high sensitivity, and is relatively likely to reach saturation. The SPAD element having a relatively low excess bias voltage $V_{EX}$, a relatively low probability PDE, and a relatively short dead time DT has a relatively low sensitivity, and is relatively unlikely to reach saturation.

In this manner, the sensitivity of the SPAD element can be adjusted on the basis of the voltage value of the excess bias voltage $V_{EX}$ applied to the SPAD element. The voltage value of the excess bias voltage $V_{EX}$ can be changed on the basis of the voltage value of the anode voltage $V_{bd}$ provided to the terminal 53 in FIGS. 3A and 3B. As described above, the anode voltage $V_{bd}$ is provided by at least one voltage source. The voltage value of the anode voltage $V_{bd}$ is typically set to a fixed value common to pixels in the pixel array unit.

Thus, in Example 3, a first pixel 65 having a relatively high sensitivity and a second pixel 66 having a relatively low sensitivity are provided in the pixel array unit 60 as illustrated in FIG. 10A by changing the voltage value of the excess bias voltage $V_{EX}$ applied to the SPAD element.

Note that this example exemplarily describes a pixel arrangement in which the first pixel 65 as a high-sensitivity pixel and the second pixel 66 as a low-sensitivity pixel are arranged in a lattice. However, the present technology is not limited to this pixel arrangement, but is basically applicable to any pixel arrangement in which the first pixel 65 and the second pixel 66 are mixed in the pixel array unit 60. In addition, the voltage value of the excess bias voltage $V_{EX}$ is not limited to setting at two stages at the first pixel 65 and the second pixel 66, but may be set at three or more stages. Specifically, the pixel arrangement may include mixture of pixels having a high-sensitivity pixel, an intermediate sensitivity pixel, and a low-sensitivity pixel.

As described above, the light reception device 30 according to Example 3 includes, in the pixel array unit 60, the first pixel 65 having a relatively high excess bias voltage $V_{EX}$ and the second pixel 66 having a relatively low excess bias voltage $V_{EX}$. With this configuration, the first pixel 65 can reliably detect photons under a condition of a small incident light quantity, and the second pixel 66 can perform the detection operation without reaching saturation under a condition of a large incident light quantity. As a result, the dynamic range of the light reception device 30 is increased.

(Exemplary Applications of Example 3)

Example 3 may be used in combination with Example 1, in combination with Example 2, or in combination with Examples 1 and 2. Specifically, the light reception device 30 may include, in the pixel array unit 60, the first pixel 61 having a relatively large pixel size and the second pixel 62 having a relatively small pixel size in addition to the first pixel 65 having a relatively high excess bias voltage $V_{EX}$ and the second pixel 66 having a relatively low excess bias voltage $V_{EX}$.

Alternatively, the light reception device 30 may include, in the pixel array unit 60, the first pixel 63 having a relatively large thickness t of the n⁻ well 72 and the second pixel 64 having a relatively small thickness t of the n⁻ well 72 in addition to the first pixel 65 having a relatively high excess bias voltage $V_{EX}$ and the second pixel 66 having a relatively low excess bias voltage $V_{EX}$.

Alternatively, the light reception device 30 may include, in the pixel array unit 60, the first pixel 61 having a relatively large pixel size and the second pixel 62 having a relatively small pixel size, and the first pixel 63 having a relatively large thickness t of the n⁻ well 72 and the second pixel 64 having a relatively small thickness t of the n⁻ well 72 in addition to the first pixel 65 having a relatively high excess bias voltage $V_{EX}$ and the second pixel 66 having a relatively low excess bias voltage $V_{EX}$.

In addition, Example 3 may have exemplary applications similar to Exemplary applications 1 to 3 of Example 1.

Exemplary Application 1

The outputs of the first pixel 65 and the second pixel 66 may be weighted in accordance with the excess bias voltage $V_{EX}$ and summed to perform light quantity determination. Specific examples thereof are same as those in Exemplary application 1 of Example 1.

Exemplary Application 2

Only a pixel (the first pixel 65 or the second pixel 66) having either excess bias voltage $V_{EX}$ may be operated depending on the intensity (light quantity) of ambient light. Specific examples thereof are same as those in Exemplary application 2 of Example 1.

Exemplary Application 3

The first pixel 65 having a relatively high excess bias voltage $V_{EX}$ and the second pixel 66 having a relatively low excess bias voltage $V_{EX}$ may be selectively used in a temporally sequential manner. Specific examples thereof are same as those in Exemplary application 3 of Example 1.

Example 4

Figure 12:
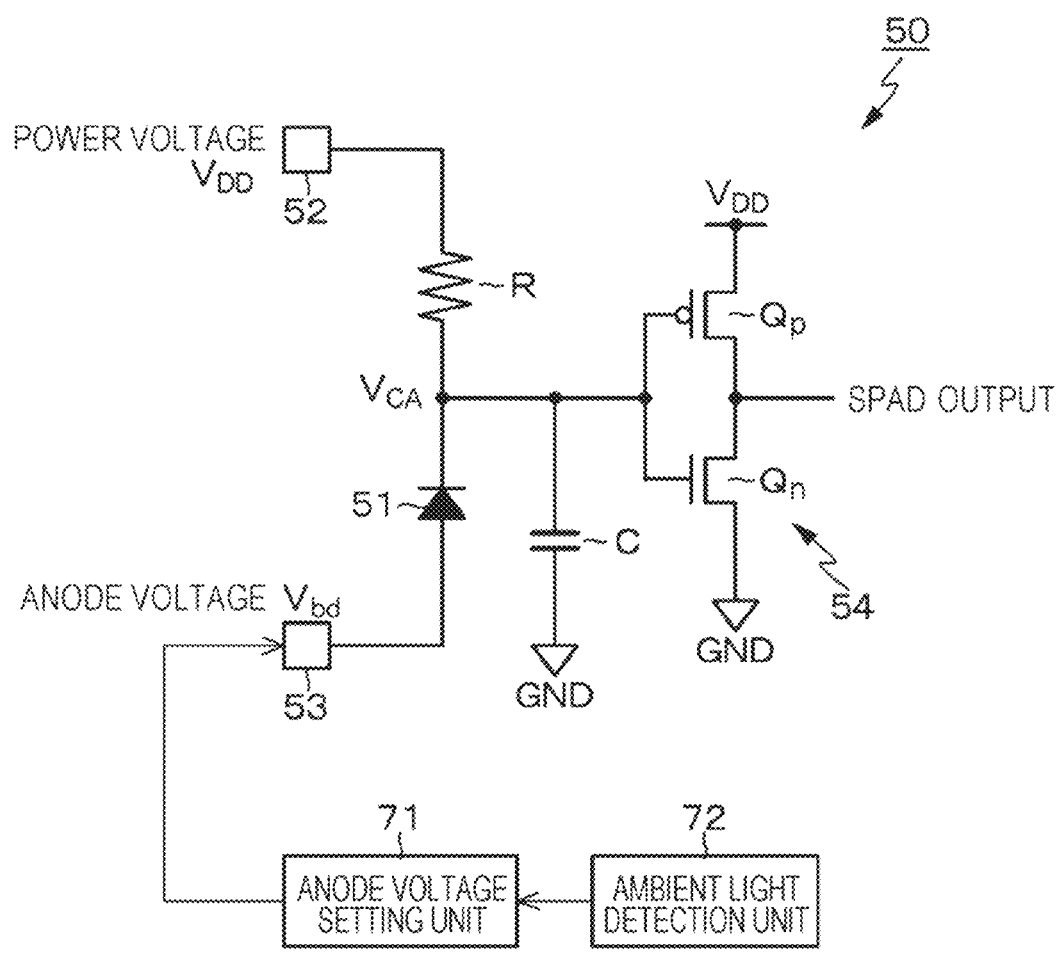
FIG. 12 is a circuit block diagram illustrating a schematic configuration of a light reception device according to Example 4.

Example 4 is a modification of Example 3, and an example in which the magnitude of the voltage value of the excess bias voltage $V_{EX}$ is adjusted in accordance with the intensity (light quantity) of ambient light. FIG. 12 illustrates a schematic configuration of the light reception device according to Example 4.

In Example 4, similarly to Example 3, the dynamic range is increased by changing the excess bias voltage $V_{EX}$ of the SPAD element, and the magnitude of the voltage value of the excess bias voltage $V_{EX}$ is adjusted in accordance with the intensity (light quantity) of ambient light. Thus, the light reception device according to Example 4 includes an anode voltage setting unit 71 configured to set the anode voltage $V_{bd}$ applied to the terminal 53 of the pixel circuit 50, and an ambient light detection unit 72 configured to detect the intensity (light quantity) of ambient light.

The anode voltage setting unit 71 sets the voltage value of the anode voltage $V_{bd}$ continuously or at stages in accordance with the intensity of ambient light detected by the ambient light detection unit 72. Accordingly, the magnitude of the voltage value of the excess bias voltage $V_{EX}$ is adjusted continuously or at stages in accordance with the intensity of ambient light. As a result, the pixel sensitivity can be changed without changing the pixel size (light reception area) or the thickness of the semiconductor layer of the light reception unit, and thus the dynamic range can be increased.

The ambient light detection unit 72 may be a publicly known light sensor. Alternatively, a LIDAR device has a preparation mode in which the degree of ambient light is determined in a non-light emission state before laser beam emission. Thus, in a case where the light reception device according to Example 4 is used as the light reception device of a distance measurement device mounted on a moving object such as an automobile, the intensity of ambient light determined in the preparation mode may be used as an input to the anode voltage setting unit 71.

Note that the above description is made on an example in which the pixel circuit illustrated in FIG. 3A is used as the pixel circuit 50 of the light reception device according to Example 4, but the same description applies to a case in which the pixel circuit illustrated in FIG. 3B is used.

<Exemplary Application of Technology According to Embodiment of the Present Disclosure>

The technology according to an embodiment of the present disclosure is applicable to various products. The following describes more specific exemplary applications. For example, the technology according to an embodiment of the present disclosure may be achieved as a distance measurement device mounted on any kinds of moving objects such as an automobile, an electric vehicle, a hybrid electric vehicle, a motorcycle, a bicycle, a personal mobility, an airplane, a drone, a ship, a robot, a construction machine, and an agriculture machine (tractor).

(Moving Object)

Figure 13:
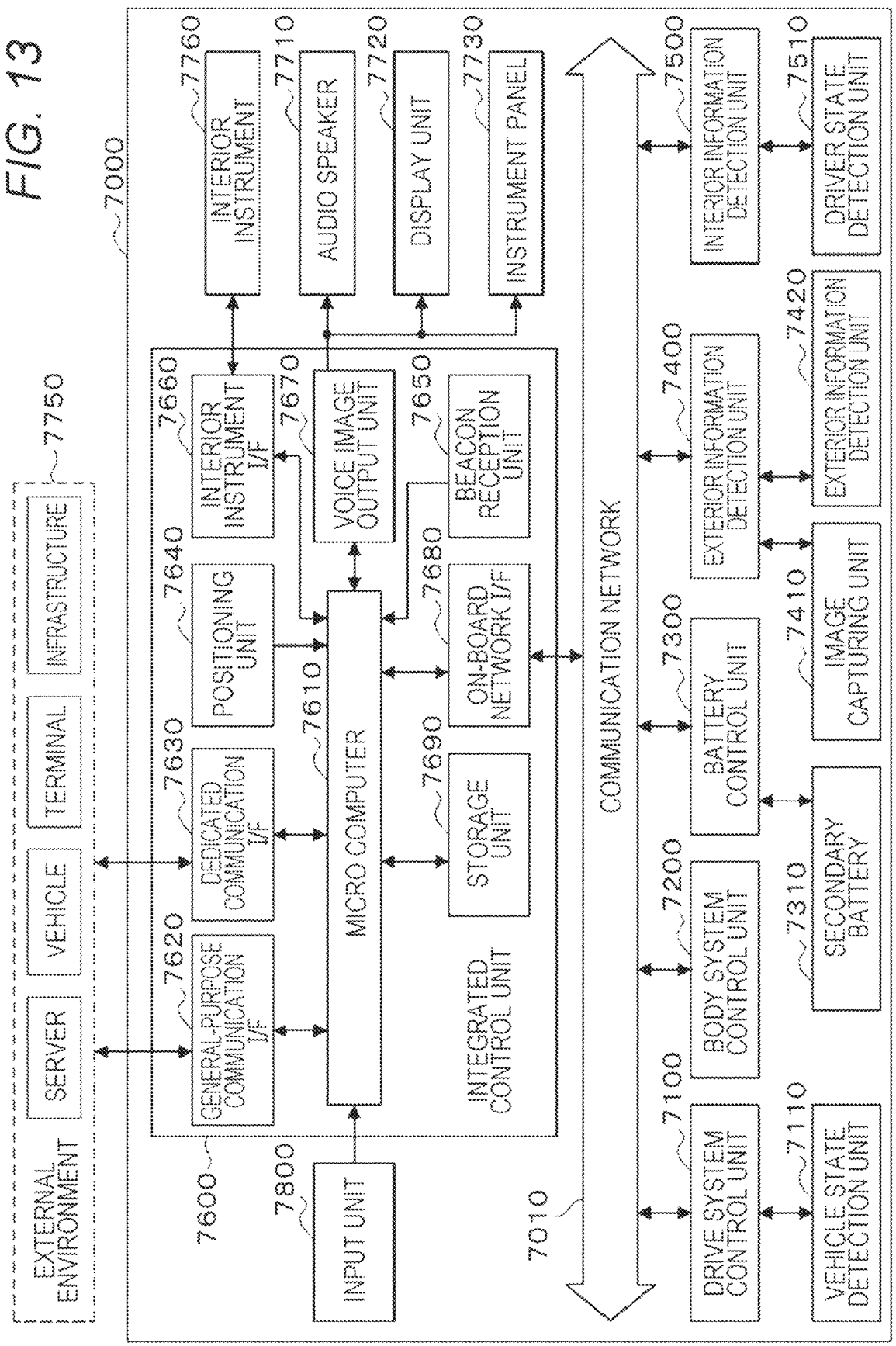
FIG. 13 is a block diagram illustrating an exemplary schematic configuration of a vehicle control system as an exemplary moving object control system to which a technology according to an embodiment of the present disclosure is applied.

FIG. 13 is a block diagram illustrating an exemplary schematic configuration of a vehicle control system 7000 as an exemplary moving object control system to which the technology according to an embodiment of the present disclosure is applicable. The vehicle control system 7000 includes a plurality of electronic control units connected with each other through a communication network 7010. In the example illustrated in FIG. 13, the vehicle control system 7000 includes a drive system control unit 7100, a body system control unit 7200, a battery control unit 7300, an exterior information detection unit 7400, an interior information detection unit 7500, and an integration control unit 7600. The communication network 7010 connecting these plurality of control units may be an on-board communication network compliant with an optional standard such as a controller area network (CAN), a local interconnect network (LIN), a local area network (LAN), or a FlexRay (registered trademark).

Each control unit includes a microcomputer configured to perform arithmetic processing in accordance with various computer programs, a storage unit configured to store, for example, computer programs executed by the microcomputer and parameters used for various calculation, and a drive circuit configured to drive various kinds of control target devices. Each control unit includes a network I/F for performing communication with another control unit through the communication network 7010, and a communication I/F for performing communication with a device, sensor, or the like in or out of a vehicle through wired communication or wireless communication. FIG. 13 illustrates, as functional configurations of the integration control unit 7600, a microcomputer 7610, a general-purpose communication I/F 7620, a dedicated communication I/F 7630, a positioning unit 7640, a beacon reception unit 7650, an interior instrument I/F 7660, a voice image output unit 7670, an on-board network I/F 7680, and a storage unit 7690. Similarly, any other control unit includes a microcomputer, a communication I/F, a storage unit, and the like.

The drive system control unit 7100 controls device operations related to the drive system of a vehicle in accordance with various computer programs. For example, the drive system control unit 7100 functions as a control device of, for example, a drive power generation device such as an internal combustion or a drive motor configured to generate drive power of the vehicle, a drive power transmission mechanism configured to transfer the drive power to wheels, a steering mechanism configured to adjust the angle of the vehicle, and a braking device configured to generate braking force of the vehicle. The drive system control unit 7100 may have the function of a control device of, for example, an antilock brake system (ABS) or an electronic stability control (ESC).

The drive system control unit 7100 is connected with a vehicle state detection unit 7110. The vehicle state detection unit 7110 includes, for example, a gyro sensor configured to detect the angular velocity of axial rotation motion of the vehicle body, an acceleration sensor configured to detect acceleration of the vehicle, and at least one of sensors configured to detect, for example, the operation amount of the acceleration pedal, the operation amount of the brake pedal, the steering angle of the steering wheel, the engine rotation speed, and the rotational speed of the wheels. The drive system control unit 7100 performs arithmetic processing by using a signal input from the vehicle state detection unit 7110, and controls an internal combustion, a drive motor, an electric power steering device, a brake device, and the like.

The body system control unit 7200 controls operations of various devices mounted on the vehicle body in accordance with various computer programs. For example, the body system control unit 7200 functions as a control device of a keyless entry system, a smart key system, a power window device, and various lamps such as a head lamp, a rear lamp, a brake lamp, an indicator, and a fog lamp. In this case, the body system control unit 7200 may receive radio wave emitted by a portable device as an alternative key or various switch signals. The body system control unit 7200 receives inputting of the radio wave or signals and controls a door lock device, a power window device, a lamp, and the like of the vehicle.

The battery control unit 7300 controls a secondary battery 7310 as an electrical power supply source of the drive motor in accordance with various computer programs. For example, the battery control unit 7300 receives information such as the battery temperature, the battery output voltage, or the battery remaining capacity from a battery device including the secondary battery 7310. The battery control unit 7300 performs arithmetic processing by using these signals, and controls adjustment of the temperature of the secondary battery 7310, or a cooling device or the like included in the battery device.

The vehicle exterior information detection unit 7400 detects information regarding the outside of the vehicle on which the vehicle control system 7000 is mounted. For example, the exterior information detection unit 7400 is connected with at least one of an image capturing unit 7410 or an exterior information detection unit 7420. The image capturing unit 7410 includes at least one of a time of flight (ToF) camera, a stereo camera, a single-lens camera, an infrared camera, or any other camera. The exterior information detection unit 7420 includes, for example, at least one of an environment sensor for detecting current weather or climate or a circumference information detection sensor for detecting any other vehicle, an obstacle, a pedestrian, or the like around the vehicle on which the vehicle control system 7000 is mounted.

For example, the environment sensor may be at least one of a raindrop sensor configured to detect rain, a mist sensor configured to detect mist, a sunshine sensor configured to detect the degree of sunshine, or a snowflake sensor configured to detect snowfall. The circumference information detection sensor may be at least one of an ultrasonic sensor, a radar device, or a light detection and ranging, laser imaging detection and ranging (LIDAR) device. The image capturing unit 7410 and the exterior information detection unit 7420 may be provided as independent sensors or devices, or may be provided as devices in which a plurality of sensors or devices are integrated.

Figure 14:
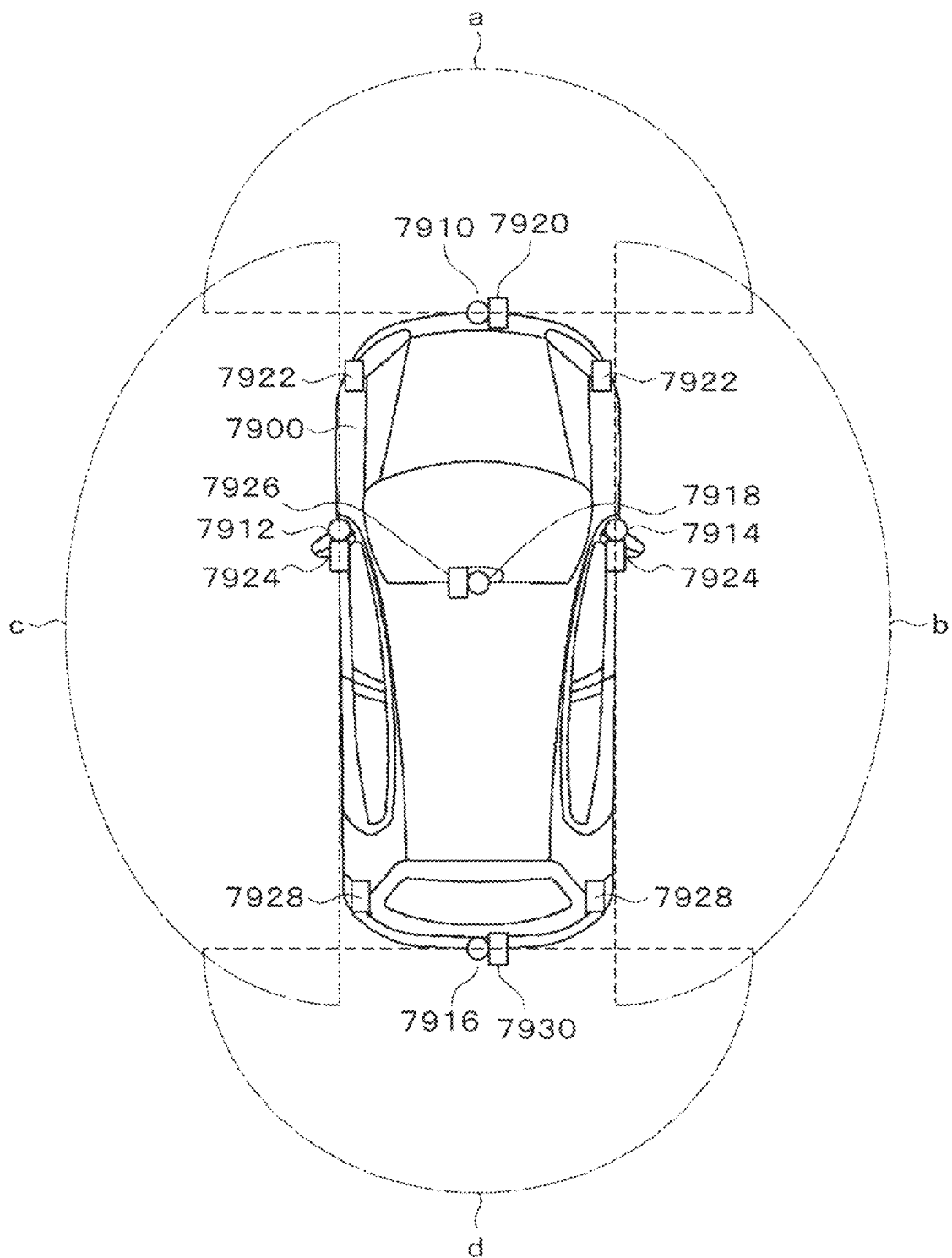
FIG. 14 is a diagram illustrating an exemplary installation position of the distance measurement device.

Here, FIG. 14 illustrates exemplary installation positions of the image capturing unit 7410 and the exterior information detection unit 7420 The image capturing units 7910, 7912, 7914, 7916, and 7918 are provided at, for example, at least one of the positions of the front nose, the side mirrors, the rear bumper, the backdoor, and an upper part of the windshield inside the vehicle of a vehicle 7900. The image capturing unit 7910 provided to the front nose and the image capturing unit 7918 provided to the upper part of the windshield inside the vehicle mainly acquire images on the front side of the vehicle 7900. The image capturing units 7912 and 7914 provided to the side mirrors mainly acquire images on sides of the vehicle 7900. The image capturing unit 7916 provided to the rear bumper or the backdoor mainly acquires an image on the back side of the vehicle 7900. The image capturing unit 7918 provided to the upper part of the windshield inside the vehicle is mainly used to detect, for example, a preceding vehicle, a pedestrian, an obstacle, a traffic light, a traffic sign, and a lane.

Note that FIG. 14 illustrates exemplary image capturing ranges of the image capturing units 7910, 7912, 7914, and 7916. Image capturing range a indicates the image capturing range of the image capturing unit 7910 provided to the front nose, Image capturing ranges b and c indicate the image capturing ranges of the image capturing units 7912 and 7914 provided to the respective side mirrors, and Image capturing range d indicates the image capturing range of the image capturing unit 7916 provided to the rear bumper or the backdoor. For example, image data captured by the image capturing units 7910, 7912, 7914, and 7916 is placed over to obtain a bird's-eye view image of the vehicle 7900 when viewed from above.

Exterior information detection units 7920, 7922, 7924, 7926, 7928, and 7930 provided at front, rear, sides, corners, and an interior upper part of the windshield of the vehicle 7900 may be each, for example, an ultrasonic wave sensor or a radar device. The exterior information detection units 7920, 7926, and 7930 provided at the front nose, the rear bumper, the backdoor, and the interior upper part of the windshield of the vehicle 7900 may be each, for example, a LIDAR device. The exterior information detection units 7920 to 7930 are mainly used for detection of a preceding vehicle, a pedestrian, an obstacle, and the like.

The description continues with reference to FIG. 13. The exterior information detection unit 7400 causes the image capturing unit 7410 to capture an exterior image and receives the captured image data. In addition, the exterior information detection unit 7400 receives detection information from the exterior information detection unit 7420 connected therewith. In a case where the exterior information detection unit 7420 is an ultrasonic wave sensor, a radar device, or a LIDAR device, the exterior information detection unit 7400 emits, for example, ultrasonic wave or electromagnetic wave, and receives information of received reflected wave. The exterior information detection unit 7400 may perform, on the basis of the received information, object detection processing or distance detection processing of a person, a car, an obstacle, a sign, a character on a road surface, and the like. The exterior information detection unit 7400 may perform, on the basis of the received information, environment recognition processing of recognizing rainfall, fog, a road surface status, and the like. The exterior information detection unit 7400 may calculate the distance to an exterior object on the basis of the received information.

In addition, the exterior information detection unit 7400 may perform, on the basis of the received image data, image recognition processing or distance detection processing of recognizing a person, a car, obstacle, a sign, a character on a road surface, and the like. The exterior information detection unit 7400 may perform processing such as distortion correction or positioning on the received image data, and may synthesize the image data with image data captured by another image capturing unit 7410 to generate a bird's-eye view image or a panoramic image. The exterior information detection unit 7400 may perform viewpoint conversion processing by using image data captured by another image capturing unit 7410.

The interior information detection unit 7500 detects interior information. The interior information detection unit 7500 is connected with, for example, a driver state detection unit 7510 configured to detect the state of the driver. The driver state detection unit 7510 may include, for example, a camera configured to capture an image of the driver, a living body sensor configured to detect living body information of the driver, or a microphone configured to collect interior voice. The living body sensor is provided to, for example, a seat surface, the steering wheel, or the like, and detects living body information of a passenger sitting on the seat or the driver holding the steering wheel. On the basis of detection information input from the driver state detection unit 7510, the interior information detection unit 7500 may calculate the fatigue degree or concentration degree of the driver or may determine whether the driver is asleep. The interior information detection unit 7500 may perform processing such as noise canceling processing on a collected voice signal.

The integration control unit 7600 controls the entire operation in the vehicle control system 7000 in accordance with various computer programs. The integration control unit 7600 is connected with an input unit 7800. The input unit 7800 is achieved by a device, such as a touch panel, a button, a microphone, a switch, or a lever, through which an input operation can be performed by a passenger. The integration control unit 7600 may receive data acquired through voice recognition of voice input through a microphone. The input unit 7800 may be, for example, a remote control device using infrared or other radio wave, or an external connection instrument such as a cellular phone or a personal digital assistant (PDA) capable of operating according to the vehicle control system 7000. The input unit 7800 may be, for example, a camera, which allows the passenger to input information through gesture. Alternatively, data obtained by detecting motion of a wearable device worn by the passenger may be input. Furthermore, the input unit 7800 may include, for example, an input control circuit or the like configured to generate an input signal on the basis of information input by a passenger or the like through the above-described input unit 7800 and output the input signal to the integration control unit 7600. The passenger or the like operates the input unit 7800 to input various kinds of data or give an instruction for a processing operation to the vehicle control system 7000.

The storage unit 7690 may include a read only memory (ROM) configured to store various computer programs executed by the microcomputer, and a random access memory (RAM) configured to store, for example, various parameters, calculation results, or sensor values. In addition, the storage unit 7690 may be achieved by, for example, a magnetic storage device such as a hard disc drive (HDD), a semiconductor storage device, an optical storage device, or a magneto-optical storage device.

The general-purpose communication I/F 7620 is a general-purpose communication I/F configured to mediate communication with various instruments present in an external environment 7750. The general-purpose communication I/F 7620 may implement a cellular communication protocol such as global system of mobile communications (GSM) (registered trademark), WiMAX, long term evolution (LTE) or LTE-advanced (LTE-A), or any other wireless communication protocol of wireless LAN (also referred to as Wi-Fi (registered trademark)), Bluetooth (registered trademark), or the like. The general-purpose communication I/F 7620 may be connected with an instrument (for example, an application server or a control server) on an external network (for example, the Internet, a cloud network, or a network unique to a business operator) through a base station or an access point, for example. In addition, the general-purpose communication I/F 7620 may be connected with a terminal (for example, a terminal of a driver, a pedestrian, or a shop, or a machine type communication (MTC) terminal near the vehicle by using, for example, a peer-to-peer (P2P) technology.

The dedicated communication I/F 7630 is a communication I/F that supports a communication protocol formulated for use in a vehicle. The dedicated communication I/F 7630 may implement a standard protocol such as wireless access in vehicle environment (WAVE), dedicated short range communications (DSRC), or cellular communication protocol as combination of IEEE802.11p of the lower-level layer and IEEE1609 of the higher-level layer. The dedicated communication I/F 7630 typically performs V2X communication as a concept including one or more of vehicle-to-vehicle communication, vehicle-to-infrastructure communication, vehicle-to-home communication, and vehicle-to-pedestrian communication.

The positioning unit 7640 receives, for example, global navigation satellite system (GNSS) signals from GNSS satellites (for example, global positioning system (GPS) signals from GPS satellites), executes positioning, and generates position information including the latitude, longitude, and altitude of the vehicle. Note that the positioning unit 7640 may specify the current position through signal interchange with a wireless access point, or may acquire position information from a terminal such as a cellular phone, a PHS, or a smartphone having a positioning function.

The beacon reception unit 7650 receives, for example, radio wave or electromagnetic wave emitted from a wireless station or the like installed on a road, and acquires information such as the current position, a traffic jam, a road closing, or a required traveling time. Note that the function of the beacon reception unit 7650 may be included in the dedicated communication I/F 7630 described above.

The interior instrument I/F 7660 is a communication interface configured to mediate connection between the microcomputer 7610 and various interior instruments 7760 in the vehicle. The interior instrument I/F 7660 may establish wireless connection by using a wireless communication protocol such as wireless LAN, Bluetooth (registered trademark), near field communication (NFC), or wireless USB (WUSB). Furthermore, the interior instrument I/F 7660 may establish wired connection such as universal serial bus (USB), high-definition multimedia interface (HDMI) (registered trademark), or mobile high-definition link (MHL) through a connection terminal (not illustrated) (and a cable, as needed). The interior instruments 7760 may include, for example, at least one of a mobile device or a wearable instrument owned by a passenger, or an information instrument conveyed into or attached to the vehicle. In addition, the interior instruments 7760 may include a navigation device configured to search for a path to an optional destination. The interior instrument I/F 7660 exchanges a control signal or a data signal with the interior instruments 7760.

The on-board network I/F 7680 is an interface configured to mediate communication between the microcomputer 7610 and the communication network 7010. The on-board network I/F 7680 communicates a signal or the like according to a predetermined protocol supported by the communication network 7010.

The microcomputer 7610 of the integration control unit 7600 controls the vehicle control system 7000 in accordance with various computer programs on the basis of information acquired through at least one of the general-purpose communication I/F 7620, the dedicated communication I/F 7630, the positioning unit 7640, the beacon reception unit 7650, the interior instrument I/F 7660, and the on-board network I/F 7680. For example, the microcomputer 7610 may calculate a control target value of a drive power generation device, a steering mechanism, or a braking device on the basis of acquired interior and exterior information, and may output a control command to the drive system control unit 7100. For example, the microcomputer 7610 may perform cooperative control to implement the function of an advanced driver assistance system (ADAS) including, for example, collision avoidance or impact reduction of the vehicle, following travel based on the inter-vehicular distance, vehicle speed maintaining travel, vehicle collision warning, or vehicle lane deviation warning. In addition, the microcomputer 7610 may perform cooperative control to achieve, for example, automated driving in which the vehicle autonomously travels independently from an operation by the driver, by controlling the drive power generation device, the steering mechanism, the braking device, and the like on the basis of acquired information around the vehicle.

The microcomputer 7610 may generate information regarding the three-dimensional distance between the vehicle and a surrounding object such as a structure or a person on the basis of information acquired through at least one of the general-purpose communication I/F 7620, the dedicated communication I/F 7630, the positioning unit 7640, the beacon reception unit 7650, the interior instrument I/F 7660, or the on-board network I/F 7680, and may produce local map information including information around the current position of the vehicle. Furthermore, the microcomputer 7610 may predict danger such as collision of the vehicle, approaching of a pedestrian or the like, or entry to a closed road on the basis of the acquired information, and may generate a warning signal. The warning signal may be, for example, a signal for generating warning sound or turning on a warning lamp.

The voice image output unit 7670 transmits at least one of a voice output signal or an image output signal to an output device capable of visually or audibly notifying a passenger in the vehicle or the outside of the vehicle of information. In the example illustrated in FIG. 13, the output device is an audio speaker 7710, a display unit 7720, or an instrument panel 7730. The display unit 7720 may include, for example, at least one of an on-board display or a head-up display. The display unit 7720 may have an augmented reality (AR) display function. The output device may be, in place of these devices, a headphone, a wearable device such as a spectacle display mounted on the passenger, a projector, a lamp, or another device. In a case where the output device is a display device, the display device visually displays a result obtained through various kinds of processing performed by the microcomputer 7610 or information received from another control unit, in various formats of text, image, table, graph, and the like. In addition, in a case where the output device is a sound output device, the sound output device converts an audio signal including, for example, played-back voice data or acoustic data into an analog signal, and audibly outputs the signal.

Note that, in the example illustrated in FIG. 13, at least two control units connected with each other through the communication network 7010 may be integrated as one control unit. Alternatively, an individual control unit may include a plurality of control units. Furthermore, the vehicle control system 7000 may include another control unit (not illustrated). In addition, part or all of the function of any control unit in the above description may be achieved by another control unit. In other words, predetermined arithmetic processing may be performed at any control unit as long as information is transmitted and received through the communication network 7010. Similarly, a sensor or a device connected with any control unit may be connected with another control unit, and a plurality of control units may mutually transmit and receive detection information through the communication network 7010.

The above describes an exemplary vehicle control system to which the technology according to an embodiment of the present disclosure is applicable. The technology according to an embodiment of the present disclosure is applicable to, for example, the image capturing units 7910, 7912, 7914, 7916, and 7918 and the exterior information detection units 7920, 7922, 7924, 7926, 7928, and 7930 among the above-described configurations. Then, when the technology according to an embodiment of the present disclosure is applied, the dynamic range of the light reception device can be increased, reaction to weak incident light is possible, and operation can be performed without reaching saturation with strong incident light, thereby achieving, for example, a vehicle control system capable of highly accurately detecting an image capturing target.

<Configurations of the Present Disclosure>

The present disclosure may be configured as described below.

<<A. Light Reception Device>>

(A-1)

A light reception device including a pixel array unit including a plurality of pixels each including a light reception unit configured to generate a signal in response to photon light reception in which the pixel array unit includes a pixel having a first sensitivity and a pixel having a second sensitivity lower than the first sensitivity.

(A-2)

The light reception device according to (A-1), in which the first sensitivity is a sensitivity that allows detection of incident light having an intensity lower than a predetermined light intensity, and the second sensitivity is a sensitivity with which saturation is not reached at a predetermined light quantity or smaller.

(A-3)

The light reception device according to (A-2), in which a light reception area of the pixel having the first sensitivity is larger than a light reception area of the pixel having the second sensitivity.

(A-4)

The light reception device according to (A-2), in which a thickness of a semiconductor layer of the light reception unit of the pixel having the first sensitivity is larger than a thickness of a semiconductor layer of the light reception unit of the pixel having the second sensitivity.

(A-5)

The light reception device according to (A-2), in which a voltage value of excess bias voltage of the pixel having the first sensitivity is higher than a voltage value of excess bias voltage of the pixel having the second sensitivity.

(A-6)

The light reception device according to (A-5), in which the voltage value of the excess bias voltage is set by a voltage value of anode voltage applied to an anode electrode of the light reception unit.

(A-7)

The light reception device according to (A-6), in which the voltage value of the anode voltage is set in accordance with an intensity of ambient light.

(A-8)

The light reception device according to any one of (A-1) to (A-7), in which the light reception unit includes a single photon avalanche diode.

<<B. Distance Measurement Device>>

(B-1)

A distance measurement device including:

a light source configured to irradiate a measurement object with light; and a light reception device configured to receive light reflected at the measurement object, in which the light reception device includes a pixel array unit including a plurality of pixels each including a light reception unit configured to generate a signal in response to photon light reception, and the pixel array unit includes a pixel having a first sensitivity and a pixel having a second sensitivity lower than the first sensitivity.

(B-2)

The distance measurement device according to (B-1), in which the first sensitivity is a sensitivity that allows detection of incident light having an intensity lower than a predetermined light intensity, and the second sensitivity is a sensitivity with which saturation is not reached at a predetermined light quantity or smaller.

(B-3)

The distance measurement device according to (B-2), in which a light reception area of the pixel having the first sensitivity is larger than a light reception area of the pixel having the second sensitivity.

(B-4)

The distance measurement device according to (B-2), in which a thickness of a semiconductor layer of the light reception unit of the pixel having the first sensitivity is larger than a thickness of a semiconductor layer of the light reception unit of the pixel having the second sensitivity.

(B-5)

The distance measurement device according to (B-2), in which a voltage value of excess bias voltage of the pixel having the first sensitivity is higher than a voltage value of excess bias voltage of the pixel having the second sensitivity.

(B-6)

The distance measurement device according to (B-5), in which the voltage value of the excess bias voltage is set by a voltage value of anode voltage applied to an anode electrode of the light reception unit.

(B-7)

The distance measurement device according to (B-6), in which the voltage value of the anode voltage is set in accordance with an intensity of ambient light.

(B-8)

The distance measurement device according to any one of (B-1) to (B-7), in which the light reception unit includes a single photon avalanche diode.

(C-1)

A light reception device, comprising:
a pixel array including a plurality of pixels, each of the plurality of pixels including a photosensitive element configured to generate a signal in response to detection of a photon by the photosensitive element,
wherein the plurality of pixels include a first pixel having a first sensitivity to detect a first photon incident on the first pixel and a second pixel having a second sensitivity to detect a second photon incident on the second pixel, wherein the second sensitivity is lower than the first sensitivity.

(C-2)

The light reception device according to (C-1), further comprising a processor in communication with the pixel array, wherein the processor is configured to count a number of signals generated by each of the photosensitive elements during a time interval.

(C-3)

The light reception device according to (C-1) or (C-2), wherein the photosensitive element of the first pixel is configured to saturate at an incident light amount less than an incident light amount at which the photosensitive element of the second pixel is configured to saturate.

(C-4)

The light reception device according to any one of (C-1) to (C-3), wherein a light reception area of the first pixel is larger than a light reception area of the second pixel.

(C-5)

The light reception device according to any one of (C-1) to (C-3), wherein a thickness of a semiconductor layer of the photosensitive element in the first pixel is larger than a thickness of a semiconductor layer of the photosensitive element in the second pixel.

(C-6)

The light reception device according to (C-5), wherein a thickness of an n-well region of the photosensitive element in the first pixel is larger than a thickness of an n-well region of the photosensitive element in the second pixel.

(C-7)

The light reception device according to any one of (C-1) to (C-3), further comprising at least one voltage source, wherein the at least one voltage source is configured to provide a first excess bias voltage to the first pixel and to provide a second excess bias voltage to the second pixel, wherein the first excess bias voltage is higher than the second excess bias voltage.

(C-8)

The light reception device according to (C-7), wherein the first excess bias voltage is set in accordance with an anode voltage received by an anode electrode of the photosensitive element in the first pixel.

(C-9)

The light reception device according to (C-8), further comprising: an ambient light detector configured to detect an intensity of ambient light, wherein the anode voltage is set in accordance with the intensity of ambient light.

(C-10)

The light reception device according to any one of (C-1) to (C-9), wherein the photosensitive element includes a single photon avalanche diode.

(C-11)

The light reception device according to any one of (C-1) to (C-10), wherein the light reception device is configured to be mounted in a vehicle.

(C-12)

The light reception device according to (C-2) or (C-3), wherein the processor is configured to apply a weighting factor to the signal output from the first pixel and/or the second pixel in response to the first sensitivity and/or the second sensitivity.

(C-13)

The light reception device according to (C-2) or (C-3), wherein the processor is configured to determine a distance from the light reception device to an object based on the number of signals counted by the processor.

(C-14)

The light reception device according to (C-2) or (C-3), wherein the processor is configured to recognize an object based on the number of signals counted by the processor.

(C-15)

The light reception device according to (C-2) or (C-3), wherein the processor is configured to detect an intensity of ambient light, wherein an operation of the first pixel and/or the second pixel is determined based on the intensity of ambient light.

(C-16)

A light reception system comprising:
a light source configured to irradiate a measurement object with light; and
a light reception device configured to receive light reflected by the measurement object, wherein
the light reception device includes a pixel array including a plurality of pixels each including a photosensitive element configured to generate a signal in response to detecting at least one photon incident on the photosensitive element, and
the pixel array unit includes a first pixel having a first sensitivity to detect a first photon incident on the first pixel and a second pixel having a second sensitivity to detect a second photon incident on the second pixel, wherein the second sensitivity is lower than the first sensitivity.

(C-17)

The light reception system according to (C-16), wherein the photosensitive element of the first pixel is configured to saturate at an incident light amount less than an incident light amount at which the photosensitive element of the second pixel is configured to saturate.

(C-18)

The light reception system according to (C-16) or (C-17), further comprising at least one voltage source, wherein the at least one voltage source is configured to provide a first excess bias voltage to the first pixel and to provide a second excess bias voltage to the second pixel, wherein the first excess bias voltage is higher than the second excess bias voltage.

(C-19)

The light reception system according to (C-18), wherein the first excess bias voltage is set in accordance with an anode voltage received by an anode electrode of the photosensitive element in the first pixel.

(C-20)

The light reception system according to any one of (C-16) to (C-19), wherein the photosensitive element includes a single photon avalanche diode.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Distance measurement device
10 Object (measurement object)
20 Light source
21 Laser driver
22 Laser light source
23 Diffusion lens
30 Light reception device
31 Light reception lens
32 Light sensor
33 Logic circuit
40 Control unit
50 Pixel circuit
51 SPAD element
60 Pixel array unit
61, 63, 65 First pixel (high-sensitivity pixel)
62, 64, 66 Second pixel (low-sensitivity pixel)
71 Anode voltage setting unit
72 Ambient light detection unit

The invention claimed is:

1. A light reception device, comprising:
a pixel array including a plurality of pixels, each of the plurality of pixels including a photosensitive element configured to generate a signal in response to detection of a photon,
wherein the plurality of pixels include:
a first pixel having a first photosensitive element consisting of a first single photon avalanche diode (SPAD) configured to output a first signal via a first inverter from a cathode of the first SPAD,
a second pixel having a second photosensitive element consisting of a second SPAD configured to output a second signal via a second inverter from a cathode of the second SPAD,
a third pixel having a third photosensitive element consisting of a third SPAD configured to output a third signal via a third inverter from a cathode of the third SPAD, wherein a light reception area of the first pixel is larger than a light reception area of the second pixel and a light reception area of the third pixel, and
a fourth pixel having a fourth photosensitive element consisting of a fourth SPAD configured to output a fourth signal via a fourth inverter from a cathode of the fourth SPAD, wherein a light reception area of the fourth pixel is larger than the light reception area of the second pixel and the light reception area of the third pixel,
wherein the second pixel is disposed between the first pixel and the third pixel, and
wherein the third pixel is disposed between the second pixel and the fourth pixel.

2. The light reception device according to claim 1, wherein the first pixel and the second pixel are in a same row of the pixel array.

3. The light reception device according to claim 1, wherein the first pixel and the second pixel are in a same column of the pixel array.

4. The light reception device according to claim 1, wherein an operation of the first pixel or the second pixel is configured to switch depending on an intensity of an ambient light.

5. The light reception device according to claim 1, wherein a thickness of a semiconductor layer of the first photosensitive element in the first pixel is larger than a thickness of a semiconductor layer of the second photosensitive element in the second pixel.

6. The light reception device according to claim 1, further comprising at least one voltage source, wherein the at least one voltage source is configured to provide a first excess bias voltage to the first pixel and to provide a second excess bias voltage to the second pixel, wherein the first excess bias voltage is higher than the second excess bias voltage.

7. The light reception device according to claim 6, wherein the first excess bias voltage is set in accordance with an anode voltage received by an anode electrode of the first photosensitive element in the first pixel.

8. The light reception device according to claim 7, further comprising:
an ambient light detector configured to detect an intensity of ambient light,
wherein the anode voltage is set in accordance with the intensity of ambient light.

9. The light reception device according to claim 1, wherein the light reception device is configured to be mounted in a vehicle.

10. The light reception device according to claim 1, wherein:
the first pixel is disposed in a first column of the pixel array,
the second pixel is disposed in a second column of the pixel array, the second column being between the first column and a third column of the pixel array,
the third pixel is disposed in the third column, the third column being between the second column and a fourth column of the pixel array, and
the fourth pixel is disposed in the fourth column.

11. The light reception device according to claim 10, wherein the first pixel, the second pixel, the third pixel, and the fourth pixel are disposed along a first line.

12. The light reception device according to claim 11, wherein the plurality of pixels further include a fifth pixel, and wherein the second pixel and the fifth pixel are disposed along a second line different from the first line.

13. The light reception device according to claim 12, wherein the first line is perpendicular to the second line.

14. A light reception system comprising:
a light source configured to irradiate a measurement object with light; and
a light reception device configured to receive light reflected by the measurement object, wherein
the light reception device includes a pixel array including a plurality of pixels, the pixel array including:
a first pixel having a first photosensitive element consisting of a first single photon avalanche diode (SPAD) configured to output a first signal via a first inverter from a cathode of the first SPAD,
a second pixel having a second photosensitive element consisting of a second SPAD configured to output a second signal via a second inverter from a cathode of the second SPAD, a third pixel having a third photosensitive element consisting of a third SPAD configured to output a third signal via a third inverter from a cathode of the third SPAD, wherein a light reception area of the first pixel is larger than a light reception area of the second pixel and a light reception area of the third pixel, and a fourth pixel having a fourth photosensitive element consisting of a fourth SPAD configured to output a fourth signal via a fourth inverter from a cathode of the fourth SPAD, wherein a light reception area of the fourth pixel is larger than the light reception area of the second pixel and the light reception area of the third pixel, wherein the second pixel and the third pixel are each disposed between the first pixel and the fourth pixel.

15. The light reception system according to claim 14, wherein the first pixel and the second pixel are in a same row of the pixel array.

16. The light reception system according to claim 14, wherein a thickness of a semiconductor layer of the photosensitive element in the first pixel is larger than a thickness of a semiconductor layer of the photosensitive element in the second pixel.

17. The light reception system according to claim 14, further comprising at least one voltage source, wherein the at least one voltage source is configured to provide a first excess bias voltage to the first pixel and to provide a second excess bias voltage to the second pixel, wherein the first excess bias voltage is higher than the second excess bias voltage.

18. A light reception device, comprising:
a pixel array including a plurality of pixels, wherein the plurality of pixels include:
  a first pixel comprising a first photosensitive element consisting of a first single photon avalanche diode (SPAD) element configured to output a first pulse signal in response to photon detection,
  a second pixel comprising a second photosensitive element consisting of a second SPAD element configured to output a second pulse signal in response to photon detection,
  a third pixel comprising a third photosensitive element consisting of a third SPAD element configured to output a third pulse signal in response to photon detection, and
  a fourth pixel comprising a fourth photosensitive element consisting of a fourth SPAD element configured to output a fourth pulse signal in response to photon detection,
wherein a light reception area of the first pixel is larger than a light reception area of the second pixel and a light reception area of the third pixel,
wherein a light reception area of the fourth pixel is larger than the light reception area of the second pixel and the light reception area of the third pixel,
wherein the second pixel is disposed between the first pixel and the third pixel, and wherein the third pixel is disposed between the second pixel and the fourth pixel.

* * * * *